United States Patent
Eguchi

(10) Patent No.: US 10,193,576 B2
(45) Date of Patent: Jan. 29, 2019

(54) MEMORY SYSTEM AND MEMORY DEVICE

(71) Applicant: TOSHIBA MEMORY CORPORATION, Minato-ku, Tokyo (JP)

(72) Inventor: Yasuyuki Eguchi, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 4 days.

(21) Appl. No.: 15/052,010

(22) Filed: Feb. 24, 2016

(65) Prior Publication Data

US 2017/0123903 A1 May 4, 2017

Related U.S. Application Data

(60) Provisional application No. 62/248,860, filed on Oct. 30, 2015.

(51) Int. Cl.
*H03M 13/29* (2006.01)
*G11C 29/52* (2006.01)
*G06F 11/10* (2006.01)
*G11C 11/56* (2006.01)
*H03M 13/53* (2006.01)
*G11C 29/04* (2006.01)

(52) U.S. Cl.
CPC ....... *H03M 13/2906* (2013.01); *G06F 11/106* (2013.01); *G11C 11/5642* (2013.01); *G11C 29/52* (2013.01); *G11C 2029/0411* (2013.01)

(58) Field of Classification Search
CPC ............ G06F 11/1068; G06F 11/1402; G06F 11/108; G11C 29/52; H03M 13/2906
See application file for complete search history.

(56) References Cited

U.S. PATENT DOCUMENTS

| | | | |
|---|---|---|---|
| 6,934,903 B1 * | 8/2005 | Keltcher | G11C 7/1006 714/763 |
| 2006/0256615 A1 | 11/2006 | Larson | |
| 2007/0033490 A1 * | 2/2007 | Moosrainer | G06F 11/1044 714/763 |
| 2007/0050667 A1 * | 3/2007 | Zohar | G06F 11/1076 714/6.2 |
| 2008/0163023 A1 * | 7/2008 | Hong | G06F 11/1072 714/752 |

(Continued)

*Primary Examiner* — April Y Blair
*Assistant Examiner* — Dipakkumar B Gandhi
(74) *Attorney, Agent, or Firm* — Holtz, Holtz & Volek PC

(57) ABSTRACT

According to one embodiment, a memory system comprises a memory array, a first ECC control circuit, and a second ECC control circuit. The memory cell array stores data, a first parity generated in association with the data based on a first error correction code (ECC) scheme, and a second parity generated in association with the data and the first parity based on a second error correction code (ECC) scheme. The first ECC control circuit executes error correction using the first ECC scheme and the first parity during a read operation on the memory cell array. The second ECC control circuit executes error correction using the second ECC scheme and the second parity during a scrub operation on the memory cell array. The first ECC scheme and the second ECC scheme have error correction capabilities of different levels.

10 Claims, 20 Drawing Sheets

| | Operation mode | Information length | Parity length | Error correction capability | ECC scheme |
|---|---|---|---|---|---|
| ECC1 | Read/write | 64 bits (8 bits x 8) | 8 bits (1 bit x 8) | 1 bit | Hamming |
| ECC2 | Scrub | 4,096 bits (512 bits x 8) | 416 bits | 32 bits | BCH |

(56) References Cited

U.S. PATENT DOCUMENTS

| | | | |
|---|---|---|---|
| 2009/0259799 A1* | 10/2009 | Wong | G06F 12/0207 |
| | | | 711/103 |
| 2011/0258362 A1* | 10/2011 | McLaren | G06F 3/0611 |
| | | | 711/5 |
| 2012/0317352 A1* | 12/2012 | Kang | G11C 11/40611 |
| | | | 711/106 |
| 2013/0104001 A1 | 4/2013 | Nakanishi et al. | |
| 2014/0122972 A1 | 5/2014 | Nakanishi et al. | |
| 2014/0351673 A1* | 11/2014 | Ware | G11C 29/785 |
| | | | 714/764 |
| 2016/0350199 A1* | 12/2016 | Bandyopadhyay | |
| | | | G06F 11/3471 |

* cited by examiner

| | Operation mode | Information length | Parity length | Error correction capability | ECC scheme |
|---|---|---|---|---|---|
| ECC1 | Read/write | 64 bits (8 bits × 8) | 8 bits (1 bit × 8) | 1 bit | Hamming |
| ECC2 | Scrub | 4,096 bits (512 bits × 8) | 416 bits | 32 bits | BCH |

F I G. 1

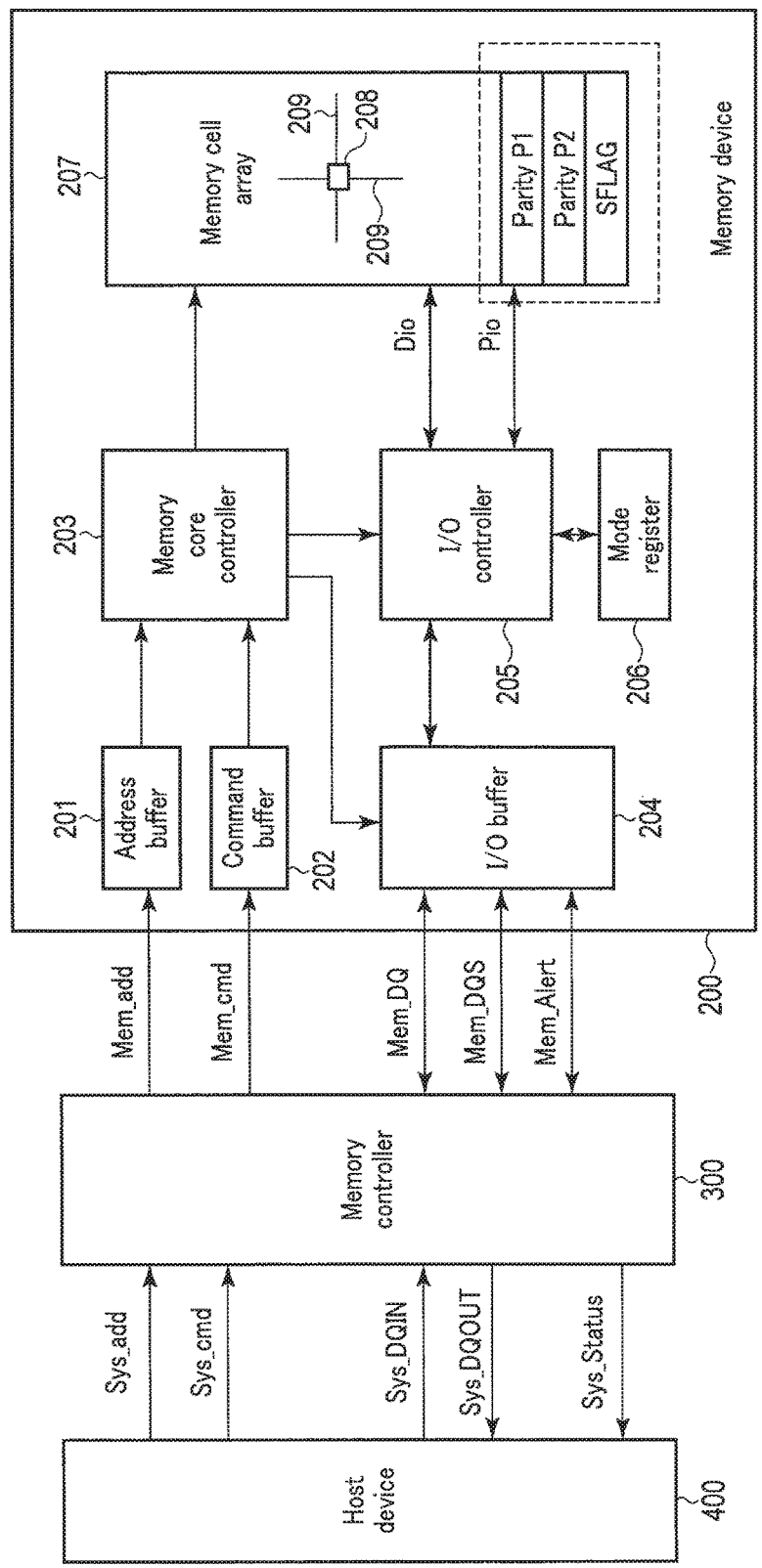
F I G. 2

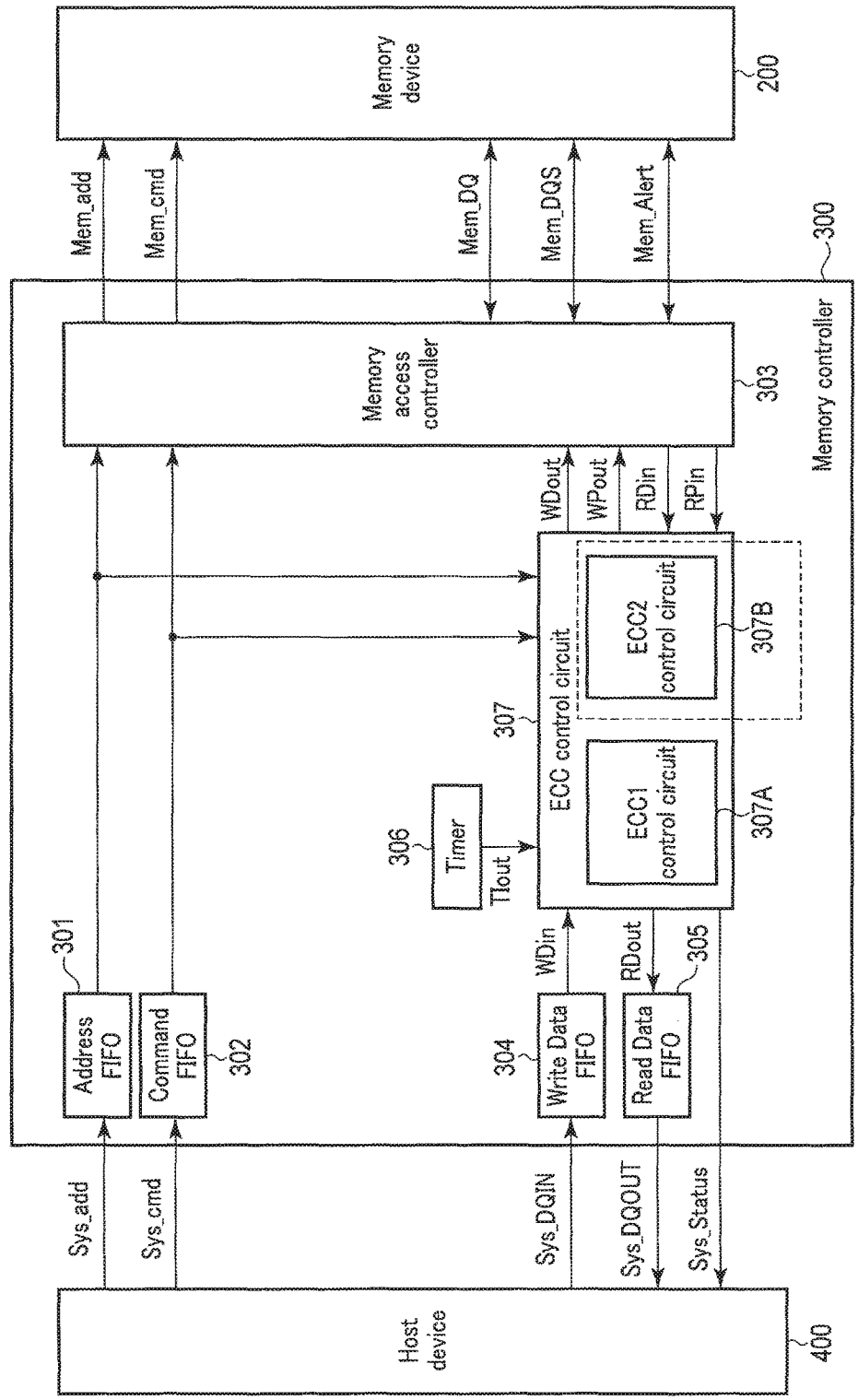
F I G. 4

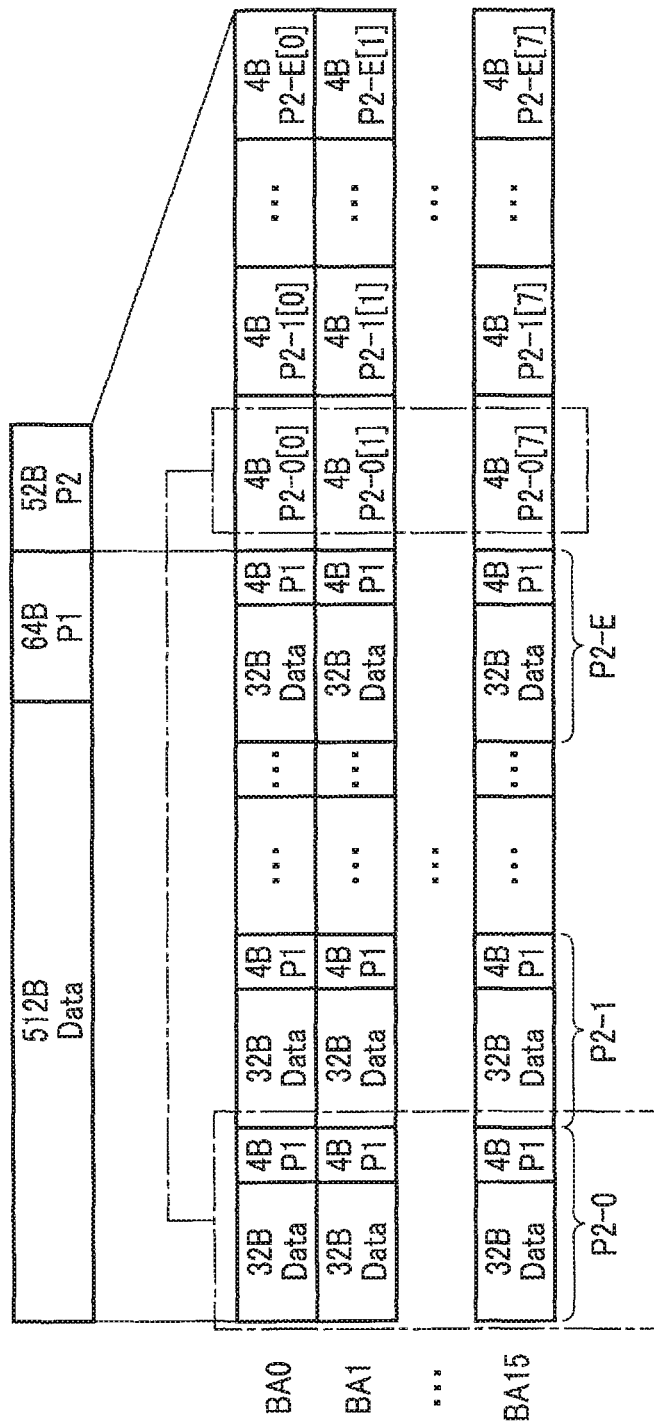
F I G. 9

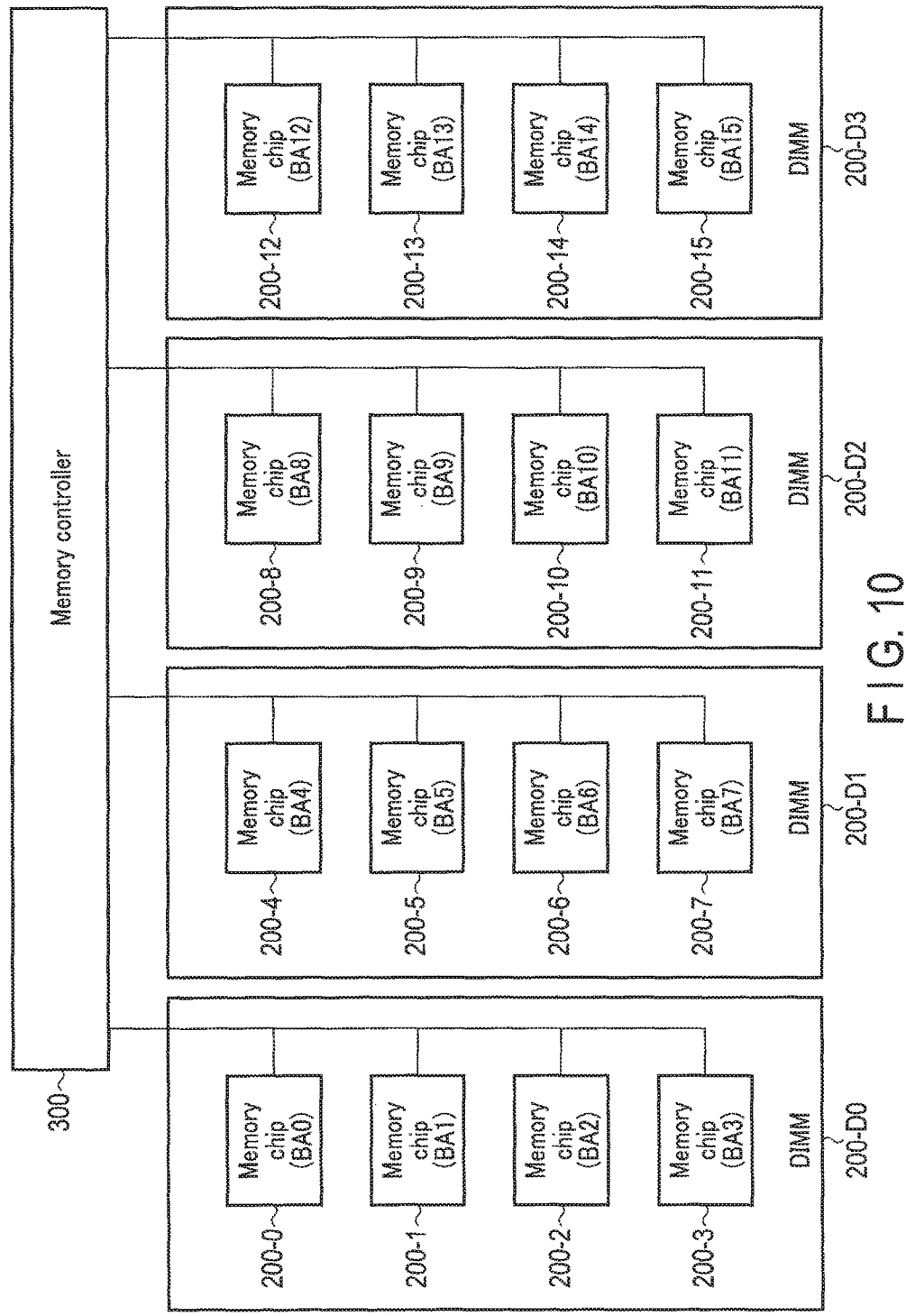
F I G. 10

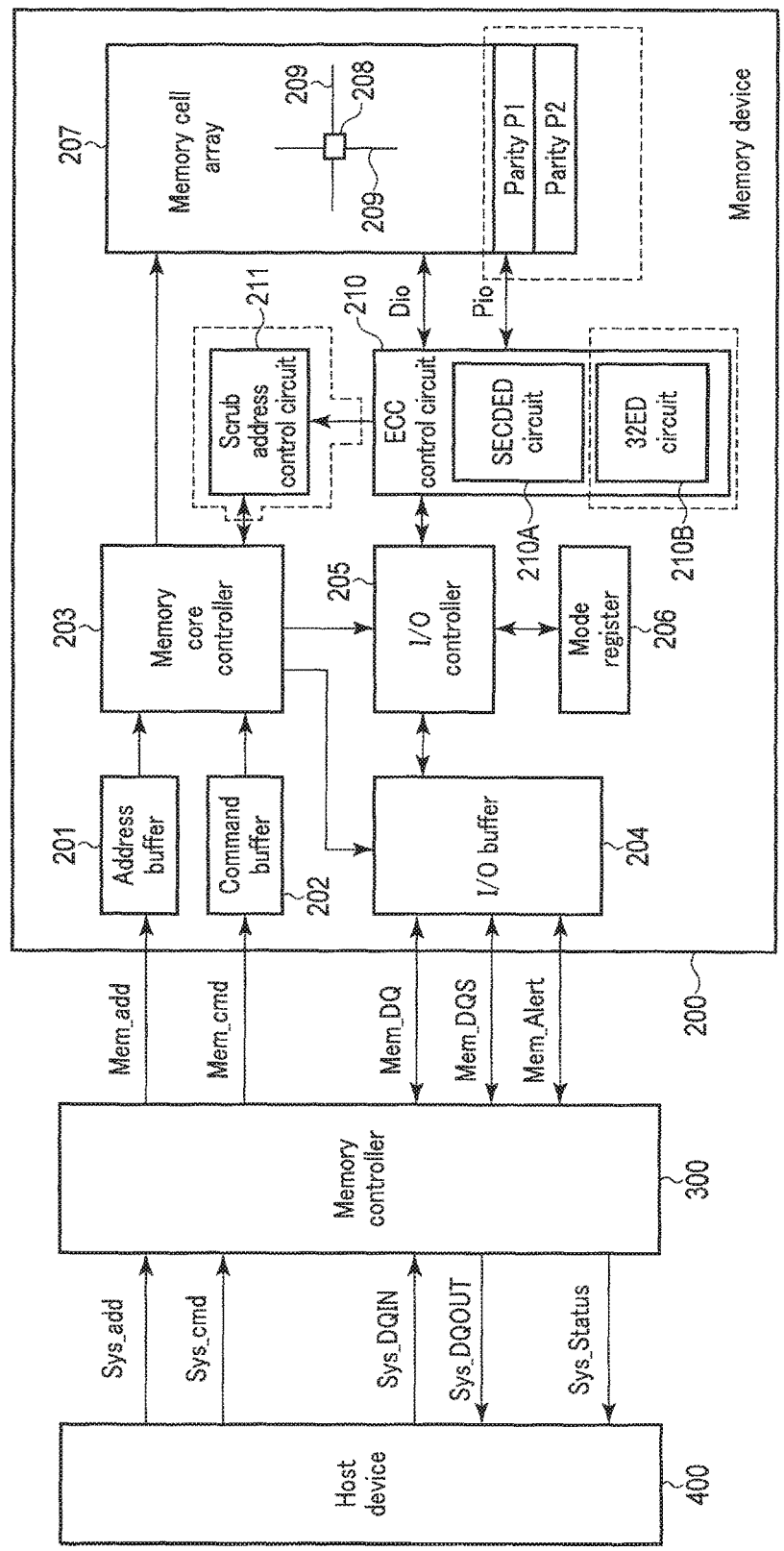
F I G. 15

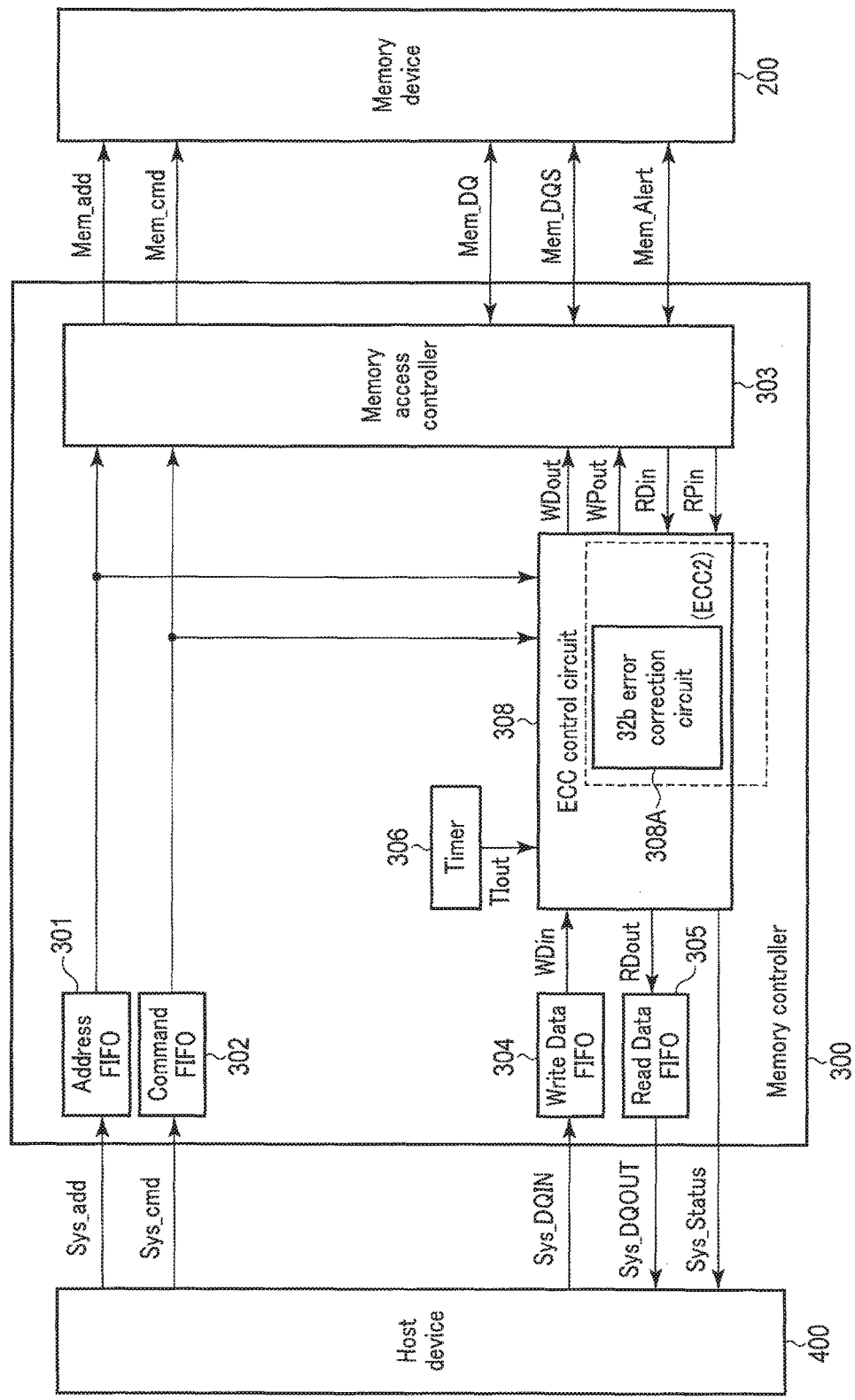
F I G. 16

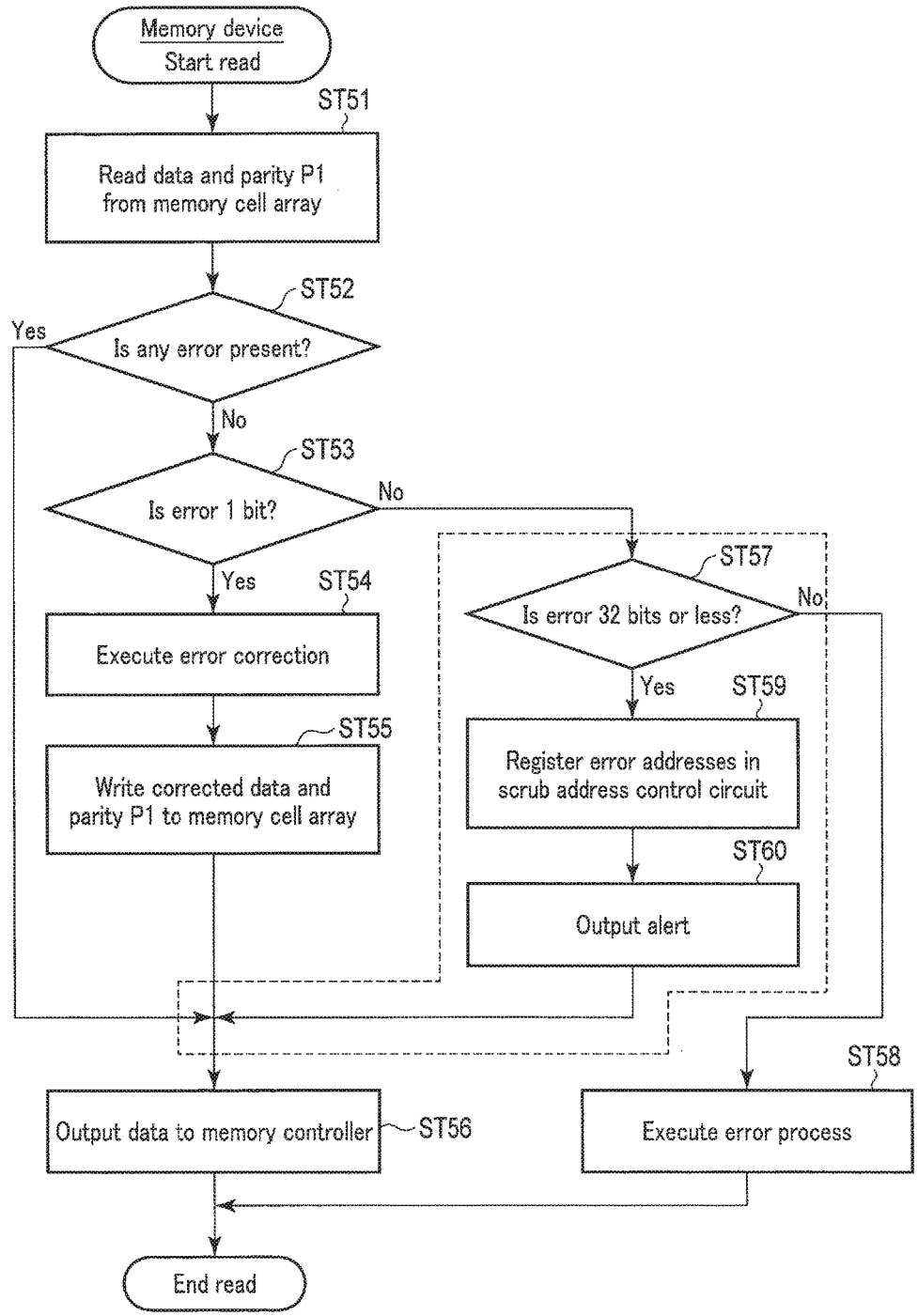
F I G. 17

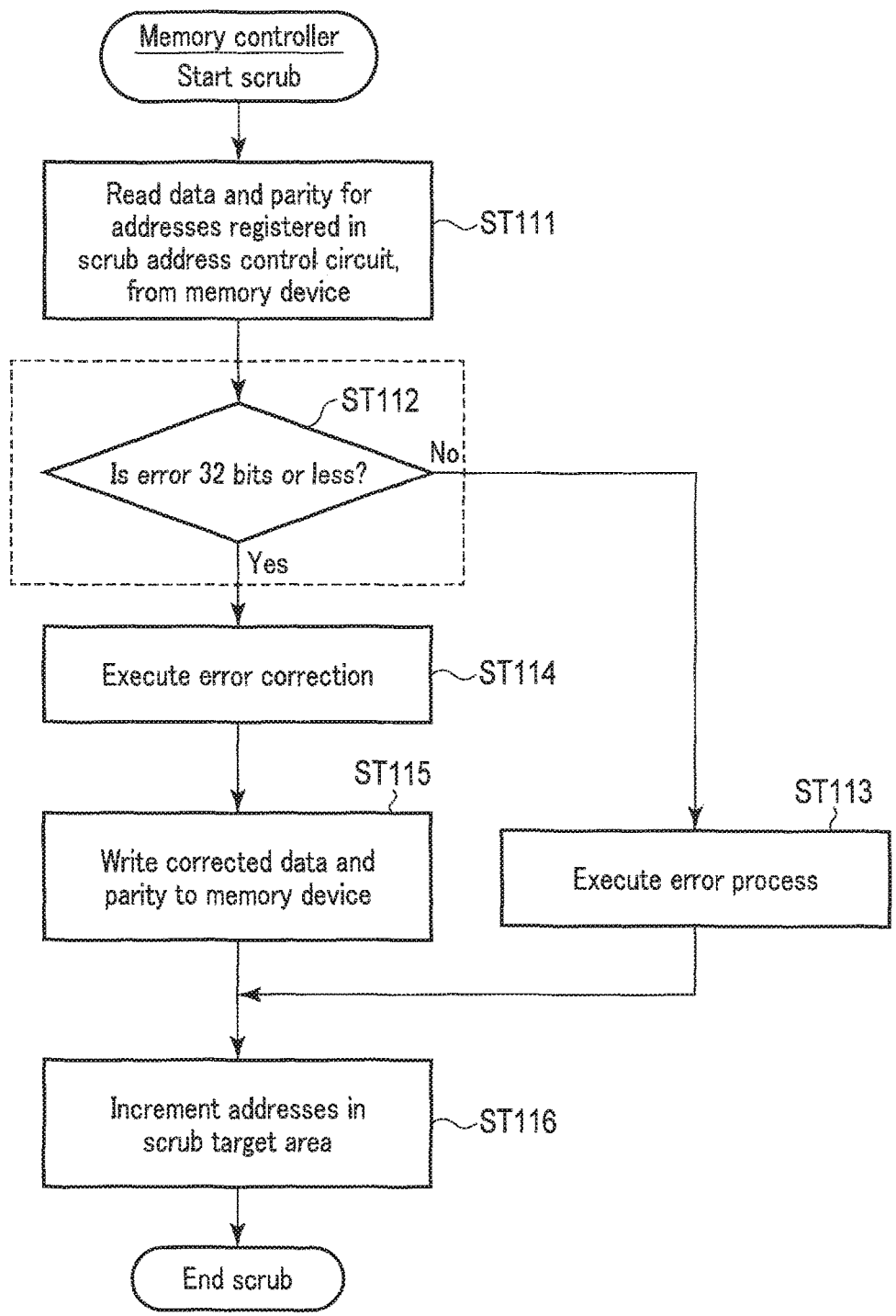
F I G. 20

MEMORY SYSTEM AND MEMORY DEVICE

CROSS-REFERENCE TO RELATED APPLICATIONS

This application is based upon and claims the benefit of U.S. Provisional Application No. 62/248,860, filed on Oct. 30, 2015, the entire contents of which are incorporated herein by reference.

FIELD

Embodiments relate to a memory system and a memory device.

BACKGROUND

Memory systems that execute error correction have been known.

BRIEF DESCRIPTION OF THE DRAWINGS

FIG. 1 is a schematic diagram illustrating two types of ECC schemes according to embodiments;

FIG. 2 is a schematic diagram depicting a configuration of a memory device according to a first embodiment;

FIG. 4 is a schematic diagram depicting a configuration of a memory controller according to a first embodiment;

FIG. 9 is a schematic diagram of a data organization in a second modification of the first embodiment;

FIG. 10 is a schematic diagram depicting a configuration with the data organization in the second modification modified;

FIG. 15 is a schematic diagram depicting a configuration of a memory device according to a second embodiment;

FIG. 16 is a schematic diagram depicting a configuration of a memory controller according to the second embodiment;

FIG. 17 is a flowchart illustrating a read operation in the memory device according to the second embodiment;

FIG. 20 is a flowchart illustrating a scrub operation in the second embodiment.

DETAILED DESCRIPTION

Figure 3:
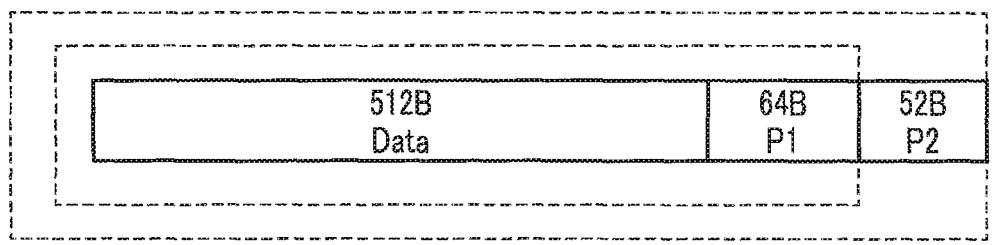
FIG. 3 is a schematic diagram depicting an example of a data organization in a memory cell array in a memory device according to the first embodiment.

In general, according to one embodiment, a memory system comprises a memory cell array, a first ECC control circuit, and a second ECC control circuit. The memory cell array stores data, a first parity generated in association with the data based on a first error correction code (ECC) scheme, and a second parity generated in association with the data and the first parity based on a second error correction code (ECC) scheme. The first ECC control circuit executes error correction using the first ECC scheme and the first parity during a read operation on the memory cell array. The second ECC control circuit executes error correction using the second ECC scheme and the second parity during a scrub operation on the memory cell array. The first ECC scheme and the second ECC scheme have error correction capabilities of different levels.

Each embodiment will be described below with reference to the drawings. For the description, components with the same functions and configurations are denoted by the same reference numerals, and duplicate descriptions are given only when needed. The drawings are schematic. The embodiments illustrate devices and methods that embody technical concepts of the embodiments. The technical concepts of the embodiments do not particularly limit the error correction code (ECC) scheme and materials, shapes, structures, arrangements, and the like of components to those described below. The description of one embodiment also applies to the description of another embodiment unless explicitly or obviously excluded.

Illustrated functional blocks can be implemented as hardware, software, or a combination thereof. Thus, each of the functional blocks will be generally described in terms of functions so as to clarify that the functional block may be any of hardware, software, and a combination thereof. Furthermore, the functional blocks are not necessarily distinguished from one another as illustrated. For example, some of the functions may be executed by functional blocks different from the illustrated functional blocks. Moreover, the illustrated functional block may be divided into smaller functional sub-blocks. The embodiment is not limited to the functional blocks specified in the embodiment. The order of flow steps illustrated in the figures can be changed unless explicitly or obviously denied.

In the embodiments described below, memory devices will be described taking MRAMs (Magnetic Random Access Memories) as an example. However, the memory devices are not limited to the MRAMs, and the embodiments are applicable to, for example, memories such as DRAMs and storages.

In each of the embodiments, an ECC scheme used for an irregular read/write operation on the memory cell array and an ECC scheme used for a periodic scrub operation (error correction operation) on the memory cell array have error correction capabilities of different levels as illustrated in FIG. 1 by way of example. Specifically, for the read/write operation, an ECC1 scheme is used which has a short latency (processing time), a small information length, and a low error correcting capability. As the ECC1 scheme, for example, Hamming codes are available which have an information length of 64 bits, a parity length of 8 bits, and an error correction capability of 1 bit. The scrub operation is a periodic error correction operation, and is performed using an ECC2 scheme having a long latency (processing time), a large information length, and a high error correction operation. As the ECC2 scheme, for example, BCH (Bose-Chaudhuri-Hocquenghem) codes are available which have an information length of 4096 bits, a parity length of 416 bits, and an error correction capability of 32 bits. Thus, by switching the level of the error correction capability depending on the operation on the memory cell array, it is possible to shorten the latency of the read/write operation, to improve the error correction capability of the scrub operation, and to minimize a parity area based on the large information length.

Two embodiments with different arrangements of an ECC control circuit will be described. A first embodiment is a configuration in which an ECC control circuit is arranged in a memory controller. A second embodiment is a configuration in which the ECC control circuit is mostly arranged in the memory device.

First Embodiment

[1-1] Configuration

Using FIGS. 2 to 4, configurations of a memory device and a memory controller in a memory system according to the first embodiment will be described.

[1-1-1] Configuration of the Memory Device

FIG. 2 is a schematic diagram depicting a configuration of a memory device in a memory system in the first embodiment. A memory device 200 is connected to a host device 400 via a memory controller 300. The memory device 200 and the memory controller 300 form a memory system.

Here, the memory device 200 is a RAM and is formed as one semiconductor chip. The memory device 200 can be implemented as a RAM of any type. The memory device 200 is configured to store data based on any known scheme. Specifically, the memory device 200 is, for example, a dynamic RAM (DRAM), a magnetoresistive RAM (MRAM), a resistive RAM (ReRAM), or a phase change RAM (PCRAM). The first embodiment is not limited by the data storage scheme for the memory device 200. Components of sections of the memory device 200 known to those skilled in the art and connections of the components vary based on the type of the RAM. Thus, FIG. 2 illustrates an example of elements widely and commonly included in the RAM. However, the memory device can have functional blocks different from the functional blocks in FIG. 2 depending on the type of the RAM. The functional blocks included in the memory device 200 are not limited to the example in FIG. 2.

The memory device 200 is connected to the memory controller 300 via a connection line so as to be able to communicate with the memory controller 300. The connection line includes, for example, a power supply line, a data bus, and a command line. The memory controller 300 supplies a command to the memory device 200 to control the memory device 200 through the command. Specifically, the memory controller 300 gives an instruction to write data to the memory device 200 or to read particular data from the memory device 200.

Here, the memory device 200 includes an address buffer 201, a command buffer 202, a memory core controller 203, an I/O buffer 204, an I/O controller 205, a mode register 206, and a memory cell array 207. In an example illustrated in FIG. 2, the memory cell array 207 is implemented on a first semiconductor chip. A first ECC control circuit 307A and a second ECC control circuit 307B in the memory controller 300 described below are mounted on a second semiconductor chip different from the first semiconductor chip.

The address buffer 201 temporarily holds an address Mem_add from the memory controller 300 and supplies the address Mem_add to the memory core controller 203. The command buffer 202 temporarily holds a command Mem_cmd from the memory controller 300 and supplies the command Mem_cmd to the memory core controller 203. The I/O buffer 204 uses a signal Mem_DQS to strobe write data DiO and a parity PiO sent through data Mem_DQ from the memory controller 300, and supplies the resultant write data DiO and parity PiO to the I/O controller 205. Furthermore, the I/O buffer 204 sends the read data DiO and the parity PiO from the I/O controller 205, through data Mem_Dq, and sends the strobe signal Mem_DQS to the memory controller 300. Under the control of the memory core controller 203, the I/O buffer 204 supplies the write data DiO and the parity PiO to the I/O controller 205 and receives the read data DiO and the parity PiO from the I/O controller 205. Under the control of the memory core controller 203, the I/O controller 205 supplies the write data DiO and the parity PiO to the memory cell array 207 and receives the read data DiO and the parity PiO from the memory cell array 207. The mode register 206, for example, holds information indicative of an operation mode. The mode register 206 is not limited to this information but may further hold various types of information. The memory core controller 203 writes data and a parity to the memory cell array 207 and reads data and a parity from the memory cell array 207 based on an address and a control signal from the address buffer 201 and the command buffer 202.

The memory cell array 207 stores data, a first parity P1 generated in association with the data based on a first error correction code (ECC) scheme, and a second parity P2 generated in association with the data and the first parity P1 based on a second error correction code (ECC) scheme. Here, the first ECC control scheme and the second ECC control scheme have error correction capabilities of different levels. The "first ECC control scheme" and the "second ECC control scheme" are also referred to as the "ECC1 scheme" and the "ECC2 scheme". The memory cell array 207 may further store a scrub flag indicative of invalidity of the second parity P2 in accordance with rewrite of at least one of the data and the first parity P1. However, the scrub flag may be omitted.

In the present embodiment, the memory cell array 207 includes a data area in which data is stored and a parity area in which the parities P1, P2 and a scrub flag (SFLAG) are stored. A dashed line enclosing the parity area is drawn to facilitate comparison with a comparative example described below. The parity P1 is used for the ECC1 scheme for the reads/write operation. The parity P2 is used for the ECC2 scheme for the scrub operation. The scrub flag indicates whether or not the parity P2 is valid. For example, the scrub flag is SFLAG=1 when the parity P2 is valid, and is SFLAG=0 when the parity P2 is invalid. However, the numerical values of the scrub flag may be reversed. The parity area may be provided separately from the memory cell array in which data is stored or may be provided in a part or all of the memory cell array 207.

Now, a relation between the data and the parities P1, P2 will be described using FIG. 3. FIG. 3 is a schematic diagram depicting an example of a data organization in which the parity P2 is assigned to each page of the memory cell array 207. In this example, a page size is 512 B. Sixty-four bits of the parity P1 and 52 B of the parity P2 are assigned to 512 B of page data.

In the ECC1 scheme, 1 B of the parity P1 corresponds to 8 B of data. That is, for the data and parity in the ECC1 scheme, 64 sets of the data and parity are organized for 512 B of data. 512 B data+64 B parity P1=64 sets*(8 B data+1 B parity).

In the ECC2 scheme, 52 B of the parity P2 correspond to 512 B+64 B of data. That is, the data and parity in the ECC2 scheme are organized as follows.

Data: 512 B of data+64 B of the parity P1
Parity: 52 B of the parity P2

The data area in the memory cell array 207 may include a plurality of banks BA not depicted in the drawings. Each of the banks BA is configured to be able to store data and includes elements such as at least a plurality of memory cells 208 and various signal lines 209.

The details of the bank BA vary depending on the type of the RAM serving as the memory device 200. For example, when the memory device 200 is an MRAM, the bank BA is configured to hold data in the memory cells 208 using a magnetoresistive effect. The memory cells in the MRAM include magnetic tunnel junction (MTJ) elements to hold data according to the state of magnetization in a nonvolatile manner.

When the memory device 200 is a DRAM, the bank BA is configured to hold data in the memory cells 208 using charge storage. The memory cells in the DRAM include capacitors and hold data in a volatile manner according to the charge held by the capacitors.

When the memory device 200 is a ReRAM or a PCRAM, the bank BA is configured to hold data in the memory cells 208 utilizing changes in resistance. The memory cells in the ReRAM include resistance change elements formed of a metal oxide or a perovskite oxide. The state of resistance is changed by changing the pulse width (pulse application period) or amplitude (current value/voltage value) of a write pulse or the polarity (application direction) of a write pulse. The memory cells in the PCRAM include phase change elements (resistance change elements) formed of calcogenide. The state of resistance is changed by a film in the phase change element being set to a crystal state or an amorphous state due to heat generated by a write current.

The signal lines 209 include, for example, bit lines or word lines. The bank BA includes a control circuit (not depicted in the drawings) for each bank.

[1-1-2] Configuration of the Memory Controller

FIG. 4 is a schematic diagram depicting a configuration of the memory controller in the memory system. The memory controller 300 comprises an address FIFO 301, a command FIFO 302, a memory access controller 303, a write data FIFO 304, a read data FIFO 305, a timer 306, and an ECC control circuit 307. The address FIFO 301 temporarily holds an address Sys_add from the host device 400 and supplies the address Sys_add to the memory access controller 303. The command buffer FIFO 302 temporarily holds a command Sys_cmd from the host device 400 and supplies the command Sys_cmd to the memory access controller 303. The write data FIFO 304 temporarily holds write data Sys_DQIN from the host device 400 and outputs write data WDin based on the data Sys_DQIN. The read data FIFO 305 temporarily holds read data RDout and outputs the read data Sys_DQOUT based on the data RDout.

Based on the command Sys_cmd, the memory access controller 303 generates an address Mem_add and a command Mem_cmd for writing data to the address Sys_add and reading data from the address Sys_add. Furthermore, the memory access controller 303 receives the data Mem_DQ and Mem_DQS and outputs read data MRDin and a parity RDin based on the data Mem_DQ and Mem_DQS. Moreover, the memory access controller 303 receives write data WDout and a parity WPout and generates the data Mem_DQ and Mem_DQS to be written to the memory device 200, from the write data WDout and the parity WPout. The timer 306 outputs a signal TIout (=a pulse at an "H" level) to the ECC control circuit 307.

As depicted in FIG. 1, the ECC control circuit 307 comprises an ECC1 control circuit 307A and an ECC2 control circuit 307B in order to execute two types of ECC schemes. The ECC1 control circuit 307A and the ECC2 control circuit 307B execute error correction in different ranges in the memory cell array 207. The ECC1 control circuit (first ECC control circuit) 307A executes error correction during the read operation on the memory cell array 207 using the ECC1 scheme and the first parity P1. The ECC2 control circuit (second ECC control circuit) 307B executes error correction during the scrub operation on the memory cell array 207 using the ECC2 scheme and the second parity P2. For example, upon receiving the signal TIout from the timer 306 or receiving a refresh command from the host device 400, the ECC2 control circuit 307B performs the scrub operation. A dashed line enclosing the ECC2 control circuit 307B is drawn to enable comparison with the comparative example described below.

Here, during the write operation, the ECC1 control circuit 307A receives the write data WDin and outputs the write data WDout based on the write data WDin. Furthermore, the ECC1 control circuit 307A generates the parity WPout (P1) in accordance with a pre-specified error correction code generation rule for the ECC1 scheme. The parity WPout (P1) is generated for each error correction unit of the write data WDin having a predetermined size.

During the read operation or the scrub operation, the ECC1 control circuit 307A receives the read data RDin and the parity RDin and uses the parity P1 to correct errors in the corresponding read data RDin. The ECC1 control circuit 307A can correct a predetermined number of (for example, 1 bit) errors in input data that is equal in size to the error correction unit (for example, a part of the read data RDin). During the read operation, the ECC1 control circuit 307A outputs the read data RDout with the errors corrected.

During the write operation, the ECC2 control circuit 307B receives the read data RDin and the parity P1 (RPin) and generates the parity P2 from the read data RDin and the parity P1 based on the ECC2 scheme and the pre-specified error correction code generation rule. The parity P2 is generated for each error correction unit of the write data WDin and each error correction unit of the parity P1. The ECC2 control circuit 307B outputs the generated parity P2 (WPout).

The ECC2 control circuit 307B receives the read data RDin and the parities P1, P2 (RPin) during the scrub operation. For 1 bit of error, the ECC2 control circuit 307B corrects the error and generates the parity P2 from the corrected data and parity P1. For at least 2 bits and at most 32 bits of errors, the ECC2 control circuit 307B uses the parity P2 to correct the errors in the corresponding read data RDin and parity P1 and generates the parity P2 from the corrected data and parity P1. In either case, the ECC2 control circuit 307B outputs the write data WDout (corrected data RDin) and the parities P1, P2 (WPout) based on the result of the error correction. The ECC2 control circuit 307B can correct a predetermined range of the number of (for example, at least 2 bits and at most 32 bits of) errors in input data that is equal in size to the error correction unit (for example, a part of the read data RDin).

[1-2] Operations

Now, operations of the memory system configured as described above will be described using FIGS. 5 to 7. In the description below, mainly the read operation, write operation, and scrub operation of the memory controller 300 will be described in order. The scrub operation is a method of executing periodical error correction in applications that need high reliability, as soft error prevention measures.

[1-2-1] Read Operation

Figure 5:
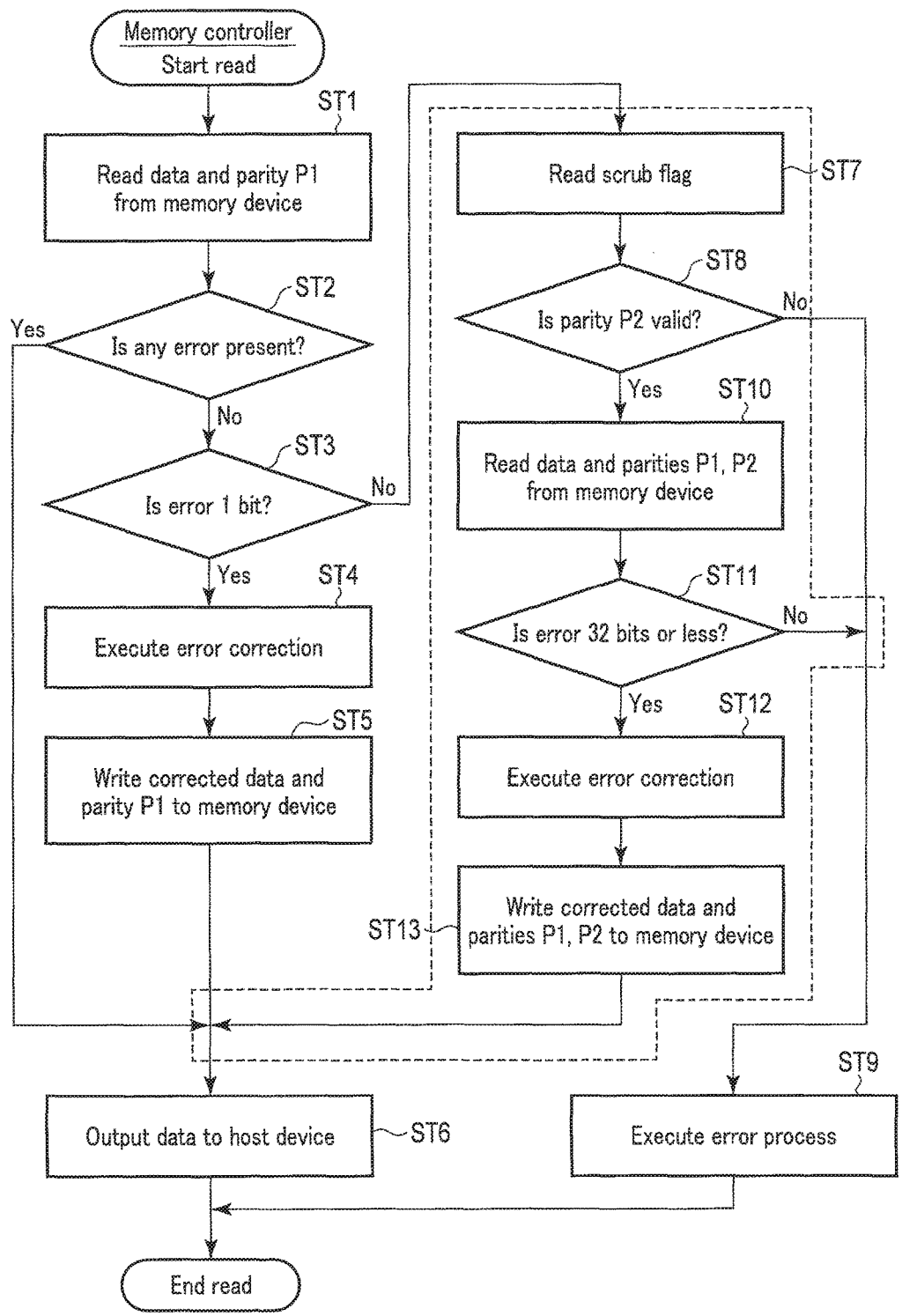
FIG. 5 is flowchart illustrating a read operation according to the first embodiment.

FIG. 5 is a flowchart illustrating the read operation of the memory controller 300. In general, in the read operation, when an attempt to make correction using the parity P1 results in the correction disabled (ST3), the scrub flag is read to determine that the parity P2 is valid (ST7 to ST8), and an attempt is made to correct errors with the powerful parity P2 (ST10 to ST11). A dashed line enclosing steps ST7 to ST13 is drawn to facilitate comparison with the comparative example described below. The read operation of the memory controller 300 will be described in detail.

First, the memory controller 300 reads the parity P1 (RPin) from the memory device 200 along with the read data RDin (ST1). For example, 8 B of data and 1 B of parity P1 are read.

The ECC1 control circuit 307A executes error correction using the parity P1 (ST2 to ST4). First, the ECC1 control circuit 307A determines whether or not an error is present in the read data RDin (ST2). When no error is present in the read data RDin, the ECC1 control circuit 307A shifts to step ST6. In step ST6, the ECC control circuit 307 outputs the read data RDout from the read data FIFO 305 to the host device 400. Thus, the read operation ends.

On the other hand, if the result of the determination in step ST2 indicates the presence of an error, the ECC1 control circuit 307A corrects the error when the error correction can be achieved based on the ECC1 scheme (ST3 to ST4). Specifically, the ECC1 control circuit 307A determines whether or not the error is 1 bit (ST3). When the error is 1 bit, the ECC1 control circuit 307A corrects the error (ST4). Subsequently, the ECC1 control circuit 307A writes the corrected data and parity P1 back to the memory device 200 (ST5). The write-back of the corrected data may be performed later. After step ST5, the ECC1 control circuit 307A shifts to step ST6 and outputs the corrected data to the host device 400 to end the read operation.

In contrast, when the result of the determination in step ST3 is negative, the ECC2 control circuit 307B reads the scrub flag from the memory device 200 (ST7).

The ECC2 control circuit 307B determines whether or not the parity P2 is valid based on the scrub flag (ST8). When the result of the determination is negative, the ECC2 control circuit 307B shifts to step ST9. In step ST9, the ECC2 control circuit 307B executes an error process. As the error process, for example, no response, a response in a predetermined error pattern, or the like can be used as needed. This also applies to error processes during other operations such as in steps ST38, ST58, ST77, and ST113 described below. After the error process, the read operation ends.

When the result of the determination in step ST8 indicates the validity of the parity P2, the memory controller 300 reads the data and the parities P1, P2 from the memory device 200 (ST10). For example, 512 B of data, 64 B of the parity P1, and 52 B of the parity P2 are read.

The ECC2 control circuit 307B corrects the error when the error correction can be achieved based on the ECC2 scheme (ST11 to ST12). Specifically, the ECC2 control circuit 307B determines whether or not the error is 32 bits or less (ST11). When the error is 32 bits or less, the ECC2 control circuit 307B corrects the error (ST12). Subsequently, the ECC2 control circuit 307B writes the corrected data and parities P1, P2 back to the memory device 200 (ST13). The write-back of the corrected data may be performed later. After step ST13, the ECC2 control circuit 307B shifts to step ST6 and outputs the corrected data to the host device 400 to end the read operation. When the result of the determination in ST11 is negative, the ECC2 control circuit 307B shifts to step ST9 to execute the error process. After the error process, the read operation ends.

[1-2-2] Write Operation

Figure 6:
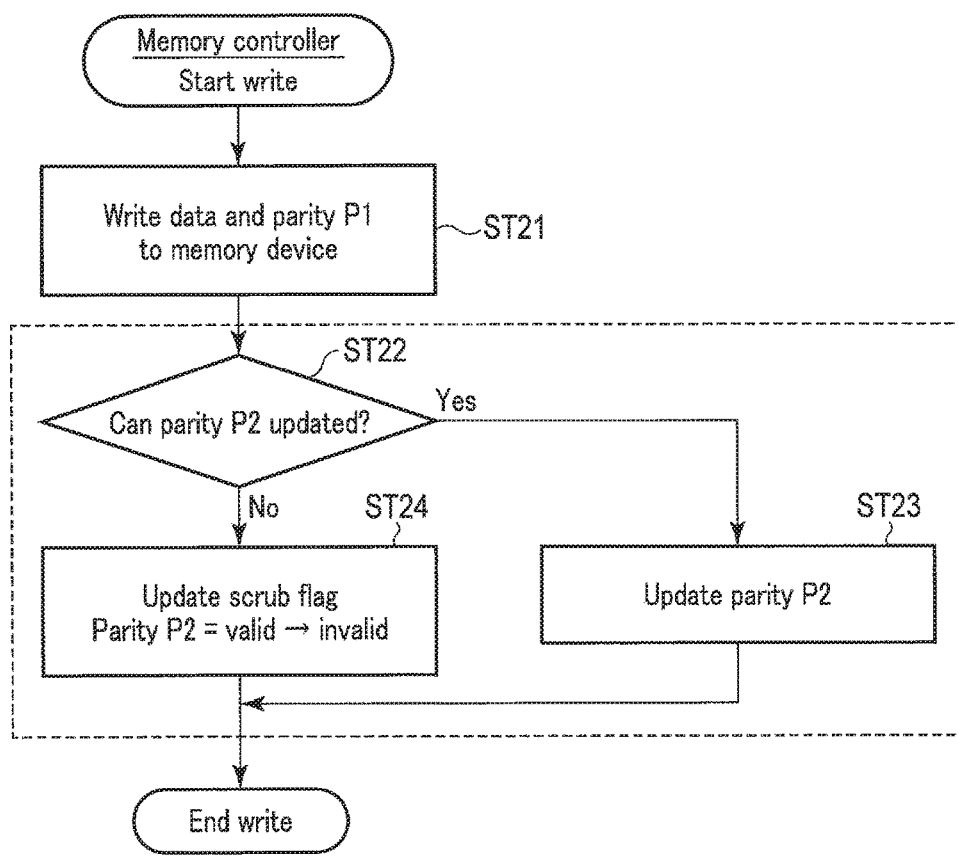
FIG. 6 is a flowchart illustrating a write operation according to the first embodiment.

FIG. 6 is a flowchart illustrating the write operation of the memory controller. A dashed line enclosing steps ST22 to ST24 is drawn to facilitate comparison with the comparative example described below. The write operation of the memory controller 300 will be described in detail.

First, the memory controller 300 writes the write data and the parity P1 to the memory device 200 (ST21).

The ECC2 control circuit 307B determines whether or not the parity P2 can be updated (ST22). When the parity P2 can be updated, the ECC2 control circuit 307B updates the parity P2 (ST23) to end the write. The parity P2 can be updated, for example, when all data needed to update the parity P2 are present in a cache or the like.

On the other hand, when the result of the determination in step ST22 is negative, the scrub flag is updated to indicate the invalidity of the parity P2 (ST24). The write then ends.

[1-2-3] Scrub Operation

Figure 7:
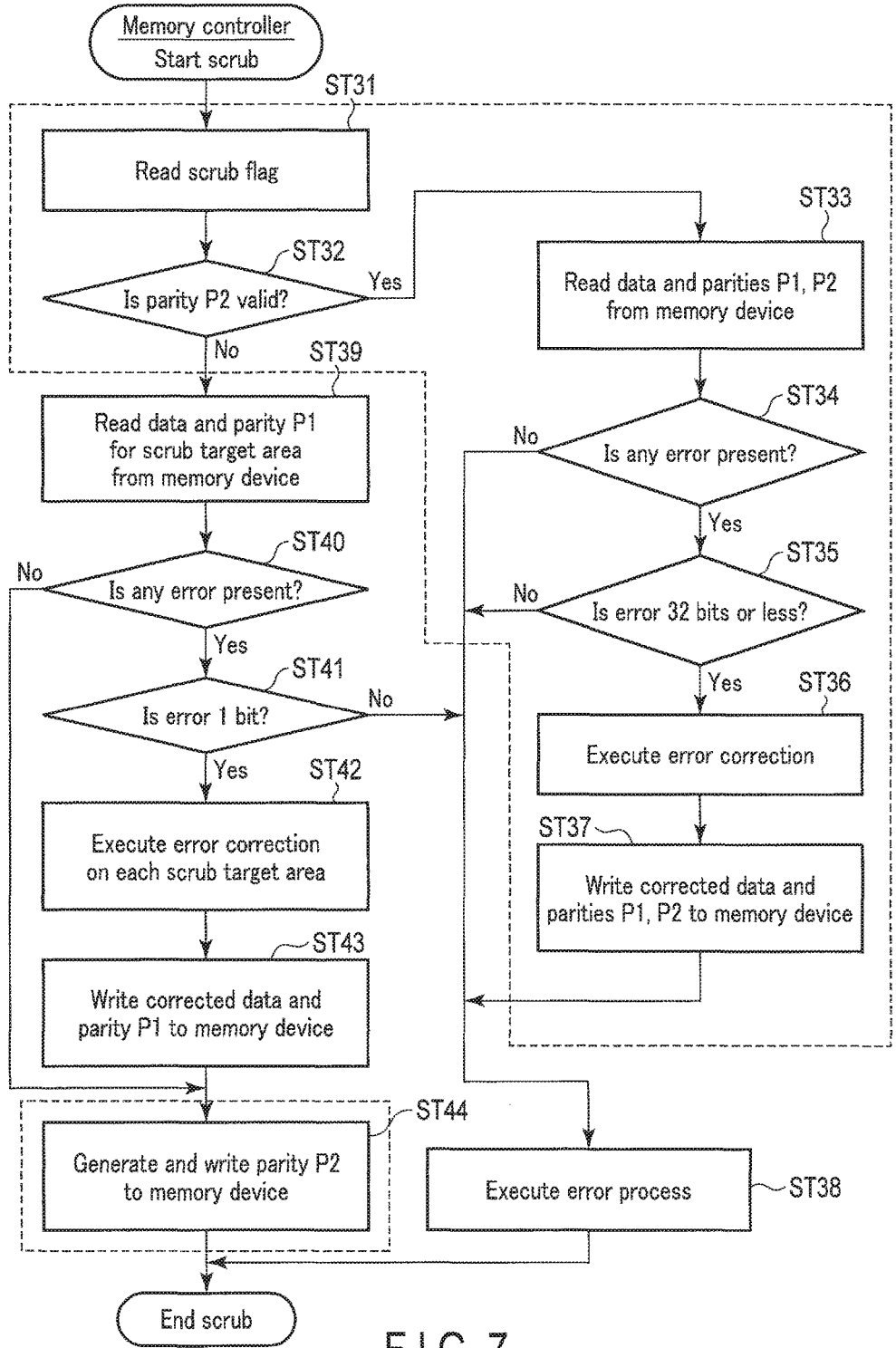
FIG. 7 is a flowchart illustrating a scrub operation according to the first embodiment.

FIG. 7 is a flowchart illustrating the scrub operation of the memory controller. A dashed line enclosing steps ST31 to ST37 is drawn to facilitate comparison with the comparative example described below. A trigger to start the scrub operation may be a signal received from the timer 306 by the ECC control circuit 307 or the refresh command received from the host device 400 by the ECC control circuit 307 and the memory access controller 303. The scrub operation of the memory controller 300 will be described below. In this description, execution of the scrub operation in units of 512 B will be described by way of example.

First, upon receiving the refresh command from the host device 400, the memory controller 300 reads the scrub flag from the memory device 200 (ST31).

The ECC2 control circuit 307B determines whether or not the parity P2 is valid based on the scrub flag (ST32). When the result of the determination is negative, the ECC2 control circuit 307B shifts to a process of reading the parity P1 and the like in step ST39.

When the result of the determination indicates the validity of the parity P2, the memory controller 300 reads the data and the parities P1, P2 from the memory device 200 (ST33). For example, 512 B of data, 64 B of the parity P1, and 52 B of the parity P2 are read.

If an error is found, the ECC2 control circuit 307B corrects the error when the error correction can be achieved (ST34 to ST36). Specifically, the ECC2 control circuit 307B determines whether or not an error is present in the data and the first parity P1 based on the parity P2 (ST34). When no error is found, the ECC2 control circuit 307B shifts to the error process in step ST38.

When the result of the determination in step ST34 indicates the presence of an error, the ECC2 control circuit 307B determines whether or not the error is 32 bit or less (ST35). When the result of the determination in step ST35 is negative, the ECC2 control circuit 307B shifts to the error process in step ST39. When the error is 32 bits or less, the ECC2 control circuit 307B corrects the error in the data and the parity P1 (ST36). Subsequently, the ECC2 control circuit 307B writes the corrected data and parity P1 and the parity P2 back to the memory device 200 (ST37). The write-back of the corrected data may be performed later.

On the other hand, when the result of the determination in step ST32 indicates the invalidity of the parity P2, the memory controller 300 reads, from the memory device 200, the data and the parity P1 for a scrub target area (ST39). For example, the memory controller 300 reads 512 B of data and 64 B of the parity P1.

The ECC1 control circuit 307A uses the parity P1 to determine whether or not an error is present in the read data (ST40). When no error is found, the ECC1 control circuit 307A shifts to step ST44.

In step ST44, the ECC1 control circuit 307A generates the parity P2 from the read data and the parity P1, and writes the parity P2 to the memory device 200 (ST44). Thus, the scrub operation ends.

On the other hand, if the result of the determination in step ST40 indicates the presence of an error, the ECC1 control circuit 307A corrects the error when the error correction can be achieved based on the ECC1 scheme (ST31 to ST43). Specifically, the ECC1 control circuit 307A determines whether or not the error is 1 bit (ST41). When the error is 1 bit, the ECC1 control circuit 307A corrects the error for each scrub target (ST42). Subsequently, the ECC1 control circuit 307A writes the corrected data and parity P1 back to the memory device 200 (ST43). The write-back of the corrected data may be performed later.

After step ST43, the ECC1 control circuit 307A shifts to step ST44. The ECC1 control circuit 307A generates the parity P2 from the corrected data and parity P1 and writes the parity P2 to the memory device 200 (ST44). Thus, the scrub operation ends.

[1-3] Effects of the First Embodiment

According to the present embodiment, the ECC1 scheme used for the read/write operation and the ECC2 scheme used for the scrub operation have error correction capabilities of different levels. Therefore, during the read/write operation, the ECC1 scheme with the low-level error correction capability may be used to reduce latency. During the scrub operation, the ECC2 scheme with the high-level error correction capability may be used to increase the error correction capability and to minimize the parity area using a large information length.

Now, the effects of the present embodiment will be described taking the memory system disclosed below as a comparative example. In the memory system in the comparative example, the parity P2 and the scrub flag related to the ECC2 scheme are omitted from the memory device, unlike in the memory device 200 depicted in FIG. 2. Furthermore, the memory controller in the comparative example does not have the ECC2 control circuit 307B but only has the ECC1 control circuit 307A. That is, the memory system in the comparative example does not produce the effects based on the ECC2 scheme.

ECC schemes that allow an error of a plurality of bits to be corrected disadvantageously fail to be applicable to memory devices such as DRAMs which have a short latency. In general, for correction of an error of a plurality of bits, an increase in the information length over which the ECC is applied enables a reduction in the rate of the parity length. In contrast, for the read/write operation, the memory device in the comparative example is compatible with a small access size such as for a byte access and fails to increase the information length over which the ECC is applied. The memory device in the comparative example needs more parity areas in order to correct an error of a plurality of bits. In addition, when requested to have enhanced reliability, the memory device in the comparative example needs the scrub operation of performing periodic error corrections as a soft error prevention measure.

Now, the read operation, the write operation, and the scrub operation of the memory system in the comparative example will be described.

The memory controller in the comparative example executes only steps ST1 to ST6 and ST9 that are included in the read operation illustrated in FIG. 5 and that are related to the ECC1 scheme. In other words, a memory controller 300c in the comparative example omits execution of steps ST7, ST8, and ST10 to ST13 that are included in the read operation illustrated in FIG. 5 and that are related to the ECC2 scheme.

The memory controller in the comparative example executes only step ST21 included in the write operation illustrated in FIG. 6 and that is related to the ECC1 scheme. In other words, the memory controller 300c in the comparative example omits execution of steps ST22 to ST24 that are included in the write operation illustrated in FIG. 6 and that are related to the ECC2 scheme.

The memory controller in the comparative example executes only steps ST38 to ST43 included in the scrub operation illustrated in FIG. 7 and that is related to the ECC1 scheme. In other words, the memory controller 300c in the comparative example omits execution of steps ST31 to ST37 and ST44 that are included in the scrub operation illustrated in FIG. 7 and that are related to the ECC2 scheme.

Therefore, the memory system in the comparative example is configured not to execute steps related to the ECC2 scheme, and thus does not produce effects based on the ECC2 scheme.

On the other hand, in the present embodiment, the ECC1 scheme used for the read/write operation and the ECC2 scheme used for the scrub operation have different levels. Therefore, in the present embodiment, degradation of performance of the ECC during the read/write operation is prevented according to the level of the ECC1 scheme and the ECC2 scheme. Furthermore, the error correction capability for the scrub operation is improved and the information length is increased, thus effectively minimizing the parity area.

[1-4] Modification of the First Embodiment

[1-4-1] First Modification

Figure 8:
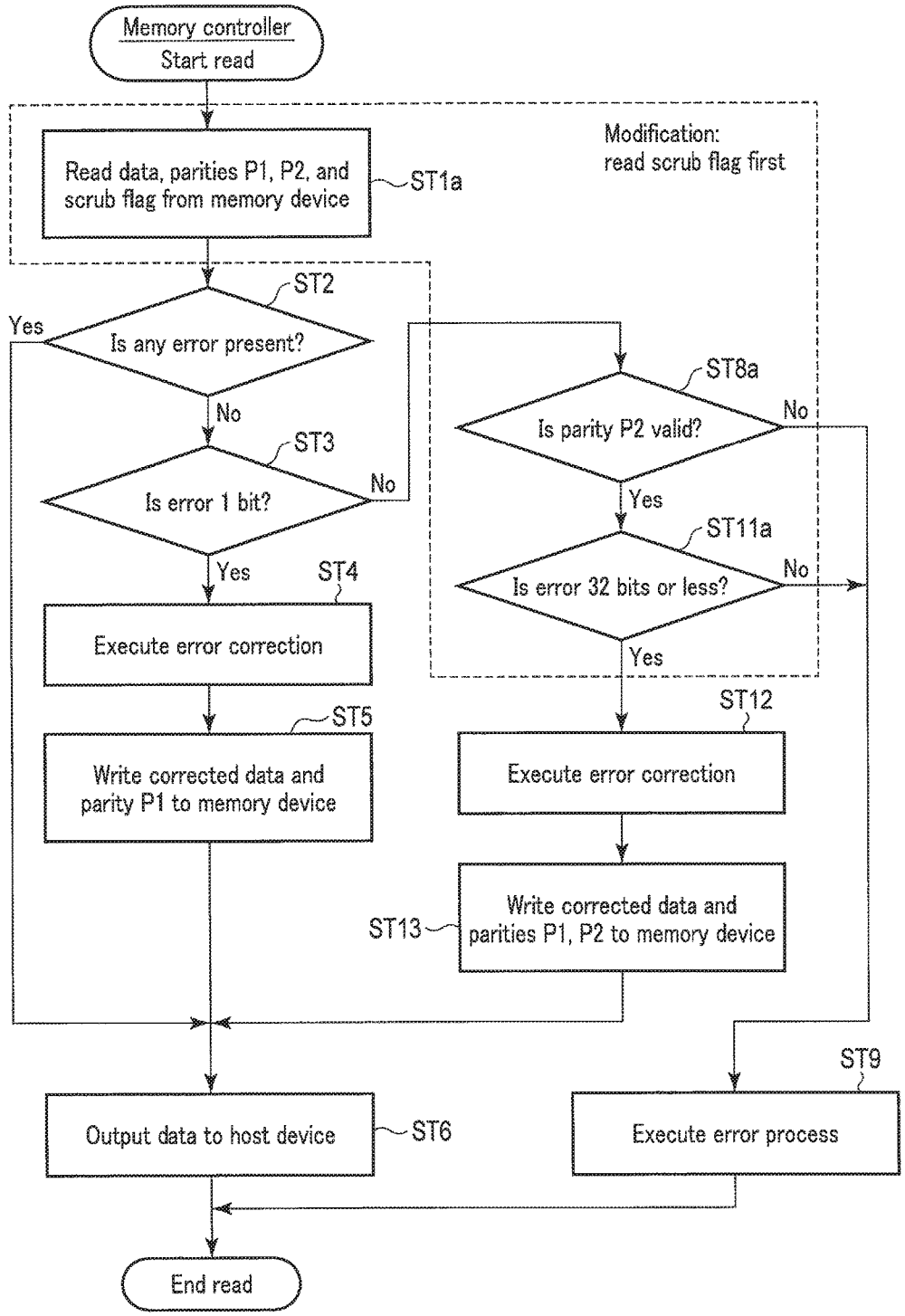
FIG. 8 is a flowchart illustrating a read operation in a first modification of the first embodiment.

A first modification of the memory controller according to the first embodiment will be described using FIG. 8. The first modification is different from the first embodiment in that, in the read operation, information related to the ECC2 scheme (parity P2 and scrub flag) is initially read.

First, the memory controller 300 reads the read data RDin, the parities P1, P2 (RPin), and the scrub flag from the memory device 200 (ST1a). For example, 512 B of data, 64 B of the parity P1, 52 B of the parity P2, and the scrub flag are read.

The ECC1 control circuit 307A executes steps ST2 to ST6 for the error correction based on the parity P1 to end the read operation as described above.

On the other hand, when the result of the determination of whether or not the error is 1 bit in step ST3 is negative, the ECC2 control circuit 307B determines whether or not the parity P2 is valid based on the scrub flag read in step ST1 (ST8a). When the result of the determination is negative, the ECC2 control circuit 307B executes the error process in step ST9 and then ends the read operation.

When the result of the determination in step ST8a indicates the validity of the parity P2, the ECC2 control circuit 307B determines whether or not the error is 32 bits or less (ST11a). When the result of the determination is negative, the ECC2 control circuit 307B executes the error process in step ST9 and then ends the read operation.

When the result of the determination in step ST11a indicates that the error is 32 bits or less, the ECC2 control circuit 307B corrects the error (ST12). Subsequently, the ECC2 control circuit 307B executes step ST13, and the ECC2 control circuit 307B executes ST6. Thus, the read operation ends.

The first modification as described above not only produces the effects of the first embodiment but also provides the configuration in which the information related to the ECC2 scheme (parity P2 and scrub flag) is initially read. Thus, the first modification allows steps ST7, ST10 related to the ECC2 scheme to be omitted.

[1-4-2-0] Summary of Second to Fourth Modifications

Second to fourth modifications of the memory system according to the first embodiment will be described. In the second to fourth modifications, the data and the first parity P1 are stored in the same bank and at the same page with the same row address. The second parity P2 is distributively stored in a plurality of banks in the memory cell array 207 or in a plurality of chips. However, the specific arrangement of the data, the first parity P1, and the second parity P2 varies among the second to fourth modifications. The modifications will be described below in order.

[1-4-2] Second Modification

First, the second modification of the memory system according to the first embodiment will be described using FIG. 9. The second modification is different from the first embodiment in that the second modification has a data organization in which the parity P2 is assigned across a plurality of banks BA0 to BA15 of the memory cell array 207.

In the second modification, 64 B of the parity P1 and 64 B of the parity P1 are assigned to 512 B of page data.

In the ECC1 scheme, 1 B of the parity P1 corresponds to 8 B of data. That is, for the data and parity in the ECC1 scheme, 64 sets of the data and parity are organized for 512 B of data. 512 B data+64 B parity P1=64 sets*(8 B data+1 B parity).

In the ECC2 scheme, 64 B of the parity P2 correspond to 512 B of data. For the data and parity in the ECC2 scheme, 32 B of data (for example, data represented as P2-0) and 4 B of the parity P2 from each page are assigned to each of the 16 banks BA0 to BA15. The pages have 16 sets of the parity P2-0 to P2-E. That is, the data and parity in the ECC2 scheme are organized as follows.

Data: 512 B of data+64 B of the parity P1=(32 B of data+4 B of the parity P1)×16 banks
Parity: 64 B of the parity P2=4 B of the parity P2×16 banks The second modification as described above not only produces the effects of the first embodiment but also provides the configuration in which the data and the parities P1, P2 are distributively saved in the plurality of banks BA0 to BA15 to allow distribution of adverse effects of data corruption caused by an acquired memory defect.

In the second modification, "a plurality of chips" may be used instead of "the plurality of banks". That is, the second modification may be modified to have a data organization in which the parity P2 is assigned across a plurality of chips. FIG. 10 is a schematic diagram depicting a configuration in which memory chips 200-0 to 200-15 are used instead of the banks BA0 to BA15 in the second modification. The memory chips 200-0 to 200-15 are semiconductor chips having the same configuration as that of the memory device 200 according to the first embodiment and are used instead of the banks BA0 to BA15. Here, the memory chips 200-0 to 200-3 are mounted, for example, in a DIMM (Dual Inline Memory Module) 200-D0. The memory chips 200-4 to 200-7 are mounted in DIMM 200-D1. The memory chips 200-8 to 200-11 are mounted in DIMM 200-D2. The memory chips 200-12 to 200-15 are mounted in DIMM 200-D3. Thus, the memory chips 200-0 to 200-15 are controlled by the memory controller 300 to allow the data and the parities P1, P2 to be assigned as is the case with the banks BA0 to BA15 illustrated in FIG. 9.

Therefore, effects similar to the effects of the second modification can also be obtained using the configuration in which the plurality of memory chips 200-0 to 200-15 are used instead of the plurality of banks BA0 to BA15 in the second modification. The data organization as depicted in FIG. 9 and FIG. 10 may be applied not only to the second modification but also to modifications and embodiments described below.

[1-4-3] Third Modification

Figure 11:
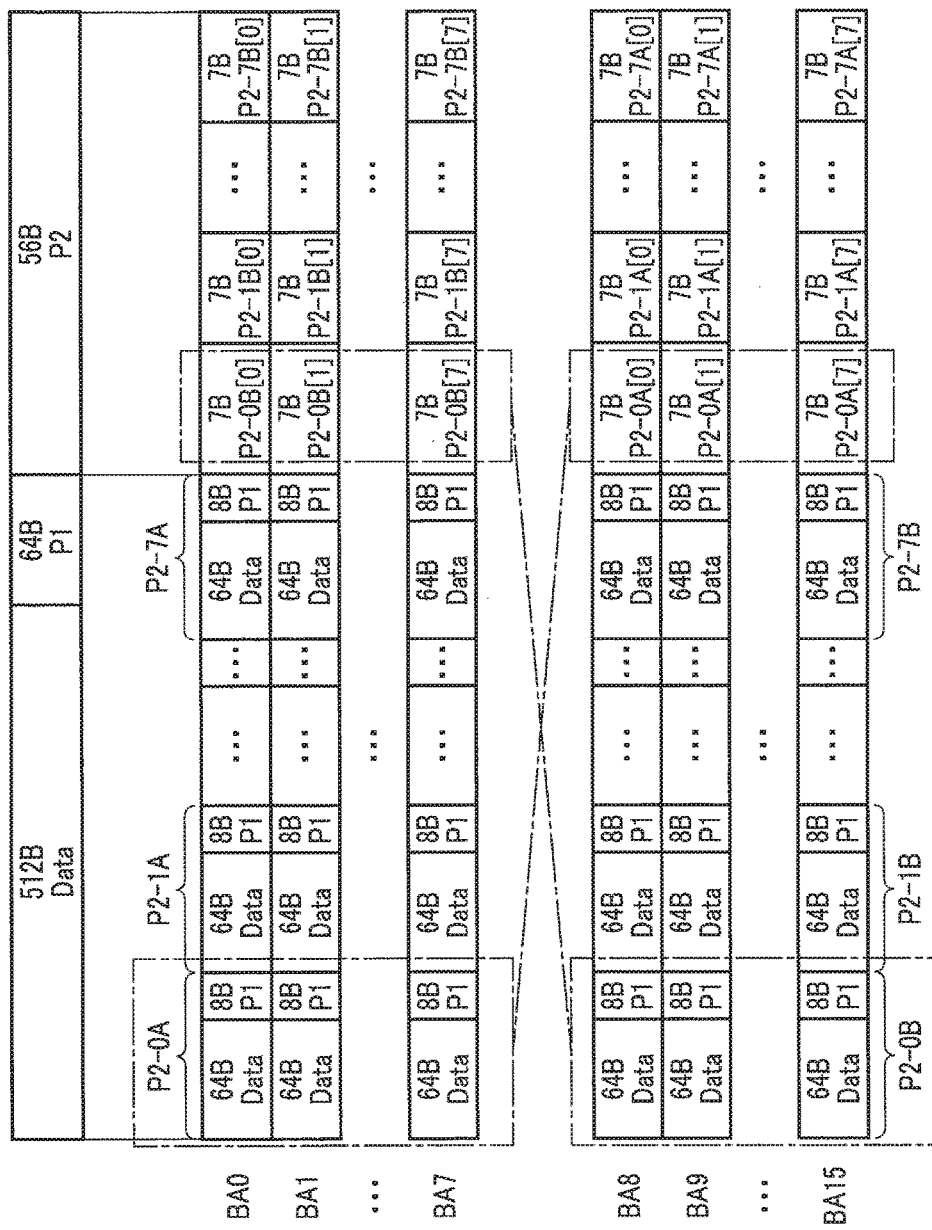
FIG. 11 is a schematic diagram of a data organization in a third modification of the first embodiment.

A third modification of the memory system in the first embodiment will be described using FIG. 11. The third modification is different from the above-described first embodiment in that the third modification has a data organization in which the parity P2 is assigned across the plurality of banks BA0 to BA7 or BA8 to BA15. However, unlike the second modification, the third modification is configured such that the plurality of banks to which the data and the parity P1 are assigned (for example, BA0 to BA7) are different from the plurality of banks to which the data and the parity P2 corresponding to the parity P1 are assigned (for example, BA8 to BA15). Further, the banks BA0 to BA7 are referred to as a first bank group. The banks BA8 to BA15 are referred to as a second bank group. In the third modification, the data and the parity P1 are assigned to one group, whereas the parity P2 is assigned to another group. In the third modification, "the plurality of banks" may be replaced with "a plurality of chips". That is, the third modification may be configured to have a data organization in which the parity P2 is assigned across a plurality of chips.

In the third modification, 64 B of the parity P1 and 56 B of the parity P2 are assigned to 512 B of page data.

In the ECC1 scheme, 1 B of the parity P1 corresponds to 8 B of data. That is, for the data and parity in the ECC1 scheme, 64 sets of the data and parity are organized for 512 B of data. 512 B data+64 B parity P1=64 sets*(8 B data+1 B parity).

In the ECC2 scheme, 56 B of the parity P2 correspond to 512 B+64 B of data. For the data and parity in the ECC2 scheme, 64 B of data and 7 B of the parity P2 from each page are assigned to each of the eight banks BA0 to BA7 or BA8 to BA15. That is, the data and parity in the ECC2 scheme are as follows.

Data: 512 B of data+64 B of the parity P1=(64 B of data+8 B of the parity P1)×8 banks
Parity: 56 B of the parity P2=7 B of the parity P2×8 banks However, the parity P2 corresponding to 512 B of data (P2-0A) in the banks BA0 to BA7 is stored in the banks BA8 to BA15. The parity P2 corresponding to 512 B of data (P2-0B) in the banks BA8 to BA15 is stored in the banks BA0 to BA7. Eight sets of the parity P2 {P2-0A, P2-1A, . . . , P2-7A} or {P2-0B, P2-1B, . . . , P2-7B} are assigned to each page.

The third modification as described above not only produces the effects of the first embodiment but also provides the configuration in which the data and parity P1 and the parity P2 are distributively saved in the different sets of plurality of bank groups such that the data and the parity P1 are saved in the bank groups {BA0 to BA7}, whereas the parity P2 is saved in the back groups {BA8 to BA15}. This allows distribution of adverse effects of data corruption caused by an acquired memory defect.

Figure 12:
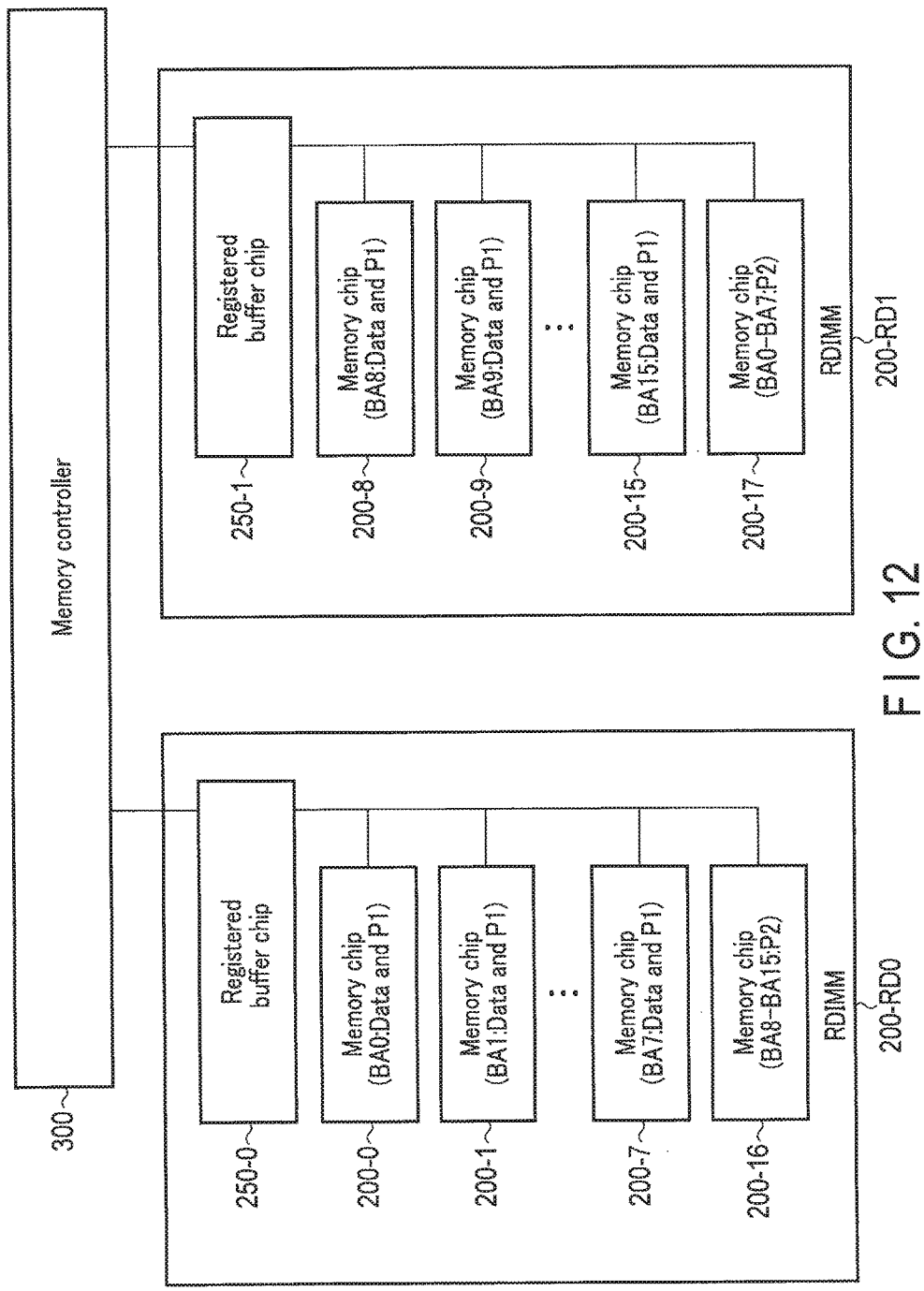
FIG. 12 is a schematic diagram depicting a configuration with the data organization in the third modification modified.

In the third modification, "a plurality of chips" may be used instead of "the plurality of banks". That is, the third modification may be modified to have a data organization in which the parity P2 is assigned across a plurality of chips. FIG. 12 is a schematic diagram depicting a configuration in which memory chips 200-0 to 200-18 are used instead of the banks BA0 to BA15 in the third modification. The memory chips 200-0 to 200-18 are semiconductor chips having the same configuration as that of the memory device 200 according to the first embodiment and are used instead of the banks BA0 to BA15. Here, the memory chips 200-0 to 200-7, 200-16 are connected to the memory controller 300 via a registered buffer chip 250-0. The registered buffer chip 250-0 temporarily stores an address signal and a control signal received from the memory controller 300, shapes and amplifies the signals, and outputs the resultant signals to the memory chips 200-0 to 200-7, 200-16. The memory chips 200-0 to 200-7, 200-16 and the registered buffer chip 250-0 are mounted in an RDIMM (Registered DIMM) 200-RD0. Similarly, the memory chips 200-8 to 200-15, 200-17 are connected to the memory controller 300 via a registered buffer chip 250-1. The registered buffer chip 250-1 temporarily stores an address signal and a control signal received from the memory controller 300, shapes and amplifies the signals, and outputs the resultant signals to the memory chips 200-8 to 200-15, 200-17. The memory chips 200-8 to 200-15, 200-17 and the registered buffer chip 250-1 are mounted in an RDIMM 200-RD1. Thus, the memory chips 200-0 to 200-17 are controlled by the memory controller 300 to allow the data and the parities P1, P2 to be assigned as is the case with the banks BA0 to BA15 depicted in FIG. 11. Further, the data and the parity P1 are assigned to the memory chips 200-0 to 200-15 as is the case with the banks BA0 to BA15. The parity P2 is assigned to the memory chip 200-16 as is the case with the banks BA8 to BA15. The parity P2 is assigned to the memory chip 200-17 as is the case with the banks BA0 to BA7.

Therefore, effects similar to the effects of the third modification can also be obtained using the configuration in which the plurality of memory chips 200-0 to 200-17 are used instead of the plurality of banks BA0 to BA15 in the third modification. The data organization as depicted in FIG. 11 and FIG. 12 may be applied not only to the second modification but also to modifications and embodiments described below.

[1-4-4] Fourth Embodiment

Figure 13:
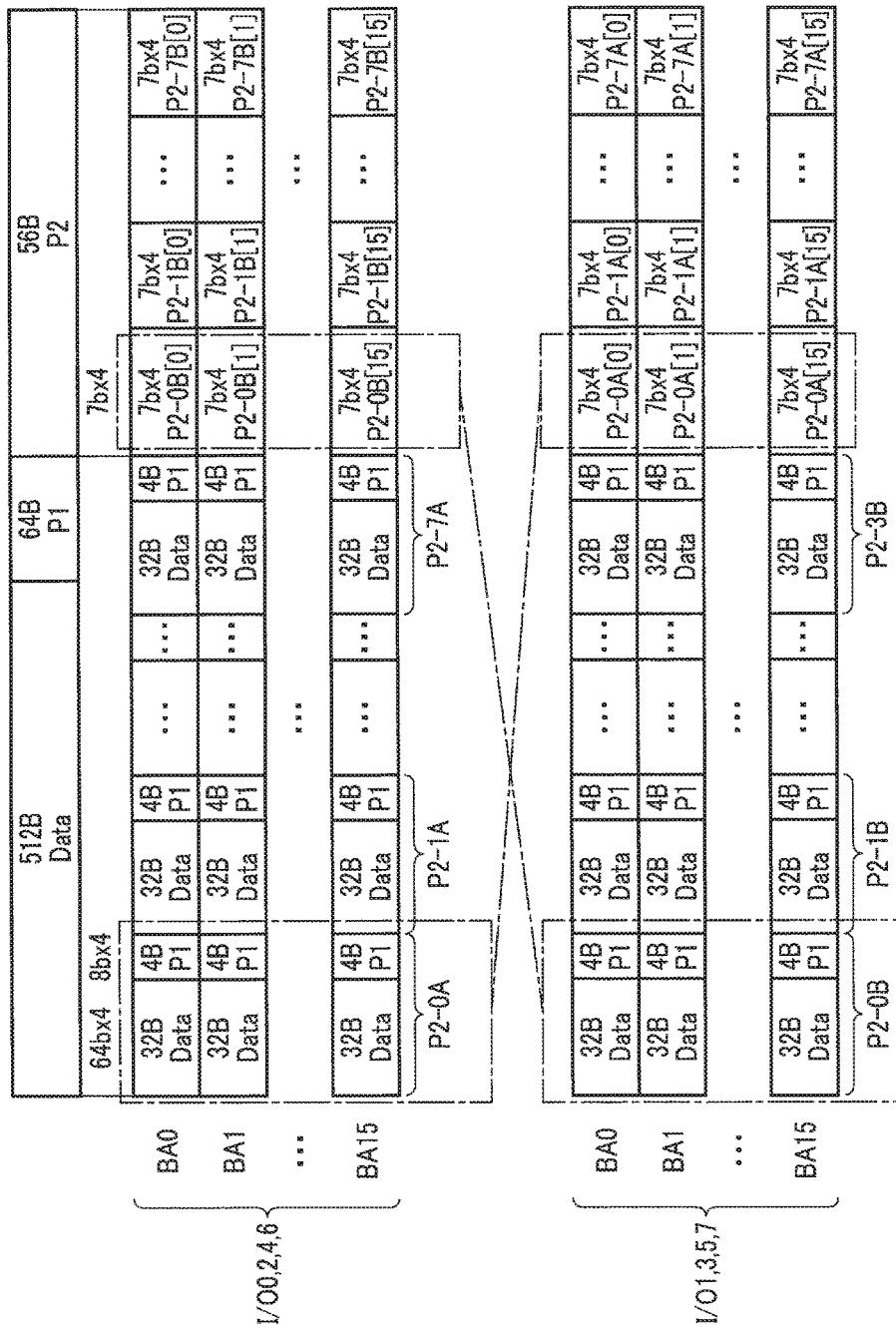
FIG. 13 is a schematic diagram of a data organization in a fourth modification of the first embodiment.

A fourth modification of the memory system according to the first embodiment will be described using FIG. 13. The fourth modification is different from the above-described first embodiment in that the fourth modification has a data organization in which the parity P2 is assigned across a plurality of I/O terminals {I/O0, I/O2, I/O4, I/O6} or {I/O1, I/O3, I/O5, I/O7} of the memory cell array 207. Further, the even-numbered I/O terminals {I/O0, I/O2, I/O4, I/O6} are referred to as a first group. The odd-numbered I/O terminals {I/O1, I/O3, I/O5, I/O7} are referred to as a second group. In the fourth modification, the data and the parity P1 are assigned to one group, and the parity P2 is assigned to another group. In the fourth modification, "a plurality of chips" may be used instead of "the plurality of I/O terminals". That is, the fourth modification may be modified to have a data organization in which the parity P2 is assigned across a plurality of chips as depicted in FIG. 12. The data organization as depicted in FIG. 12 and FIG. 13 may be applied not only to the fourth modification but also to modifications and embodiments described below.

In the fourth modification, 64 B of the parity B1 and 50 B of the parity 2 are assigned to 512 B of page data.

In the ECC1 scheme, 1 B of the parity P1 corresponds to 8 B of data. That is, for the data and parity in the ECC1 scheme, 64 sets of the data and parity are organized for 512 B of data. 512 B data+64 B parity P1–64 sets*(8 B data+1 B parity).

In the ECC2 scheme, 56 B of the parity P2 correspond to 512 B+64 B of data. For the data and parity in the ECC2 scheme, 64 B*4·I/O (32 B) and 7 B*4·I/O (3.5 B) of the parity P2 from each page are assigned to the I/O0, I/O2, I/O4, I/O6 of the 16 banks. That is, the data and parity in the ECC2 scheme are as follows.

Data: 512 B of data+64 B of the parity P1=(32 B of data+4 B of the parity P1)×16 banks Parity: 56 B of the parity P2=7 b×4 of the parity P2×16 banks However, the parity P2 corresponding to 512 B of data (P2-0A) in the page of the I/O0, I/O2, I/O4, I/O6 is stored in the page of the I/O1, I/O3, I/O5, I/O7. The parity P2 corresponding to 512 B of data (P2-0B) in the I/O1, I/O3, I/O5, I/O7 is stored in the page in the I/O2, I/O4, I/O6, I/O8. Eight sets of the parity P2 {P2-0A, P2-1A, . . . , P2-7A} or {P2-0B, P2-1B, . . . , P2-7B} are assigned to each page.

The fourth modification as described above not only produces the effects of the first embodiment but also provides the configuration in which the data and parity P1 and the parity P2 are distributively saved in the different groups, that is, in {I/O0, I/O2, I/O4, I/O6} or {I/O0, I/O2, I/O4, I/O6}. This allows distribution of adverse effects of data corruption caused by an acquired memory defect.

[1-4-5] Fifth Modification

Figure 14:
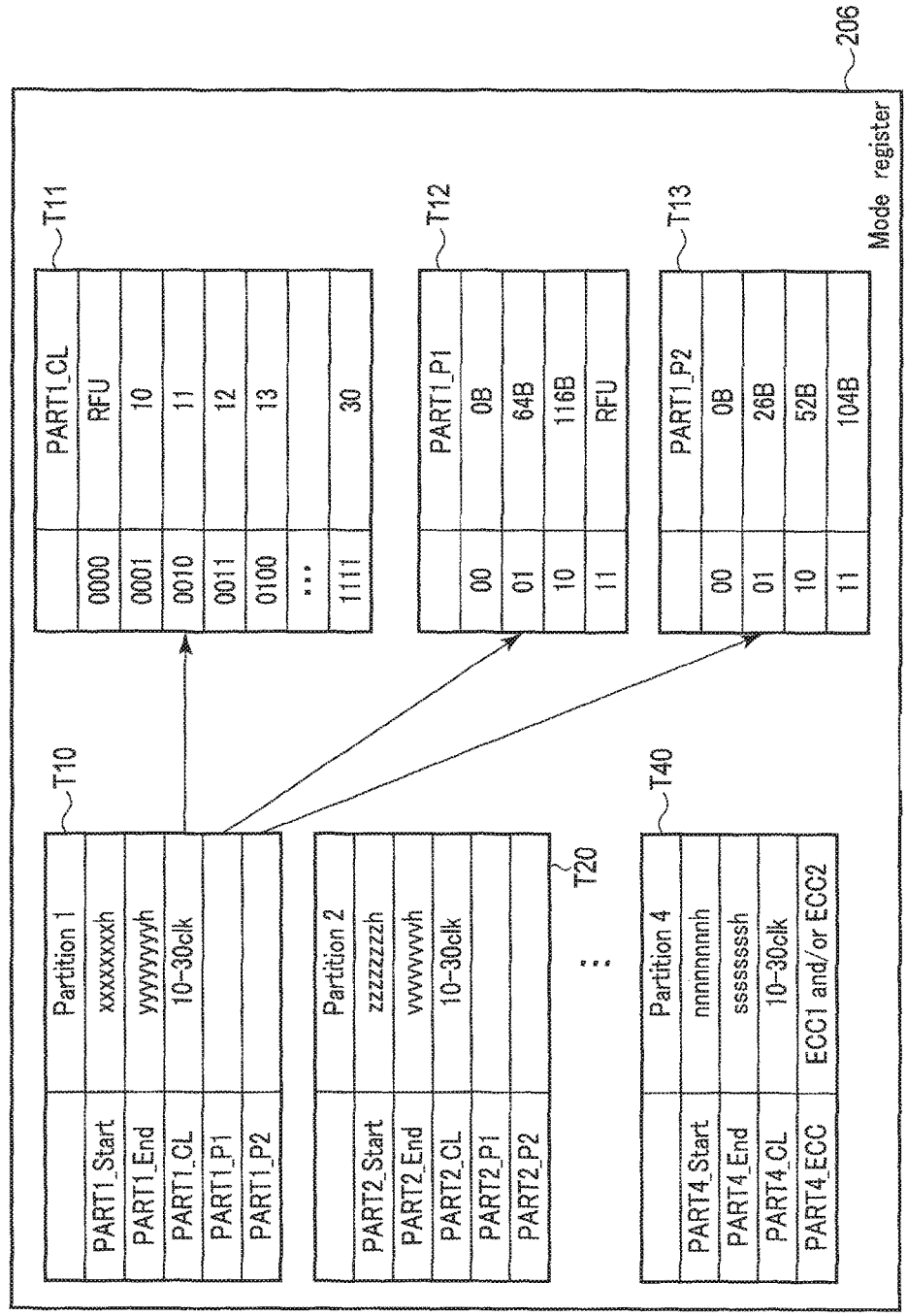
FIG. 14 is a schematic diagram illustrating setting information in a fifth modification of the first embodiment.

A modification of the memory system according to the first embodiment will be described using FIG. 14. The fifth modification is different from the above-described embodiment in that, when a storage area in the memory cell array 207 is divided into a plurality of partitions for use, the ECC and the latency are set for each of the partitions. Setting information on the ECC and latency for each partition is saved, for example, in the memory cell array 207. The setting information is read from the memory cell array 207 and saved to the mode register 206 when the memory device 200 is started as depicted in FIG. 14.

The setting information enables, for example, selection from four partitions. Setting information on the first partition includes four tables T10 to T13. This also applies to setting information on a second partition and a third partition. Setting information on a fourth partition includes a value that designates the ECC scheme instead of the value for the parities P1, P2. Tables T10 to T13 that are setting information on the first partition will be described below by way of example.

The table T10 is identified by a partition name "Partition 1" and contains items and values set in association with one another. The items in Table T10 include "PART1_Start", "PART1_End", "PART1_CL", "PART1_P1", and "PART1_P2". The item "PART1_Start" is indicative of the start address of the partition. The item "PART1_End" is indicative of the end address of the partition. The item "PART1_CL" is indicative of a CAS latency. "CAS" is an abbreviation of "Column Address Strobe". The item "PART1_P1" is indicative of the size of the parity P1 per page. The item "PART1_P2" is indicative of the size of the parity P2 per page. Values corresponding to the items "PART1_CL", "PART1_P1", and "PART1_P2" can be selected from the tables T11, T12, T13. It is possible to set any number of bytes for values corresponding to the items "PART2_P1" and "PART1_P2" instead of selecting from the tables T12, T13.

The table T11 is identified by an item "PART1_CL" in the table T10 and pre-contains codes and values. Codes "0000", "0001", ..., "1111" in Table 11 are information set as values for the item "PART1_CL" in the table T10. Values "RFU", "10", ..., "30" are values for the CAS latency corresponding to the codes. The value "RFU" in the table T11 is an abbreviation of "Reserved for Future Use". This abbreviation applies to the other tables.

The table T12 is identified by an item "PART1_P1" in the table T10 and pre-contains codes and values. Codes "00", "01", ..., "11" in Table 12 are information set as values for the item "PART1_P1" in the table T10. Values "0 B", "64 B", ..., RFU" in the table T12 are the sizes of the parity P1 corresponding to the codes.

The table T13 is identified by an item "PART1_P2" in the table T10 and pre-contains codes and values. Codes "00", "01", ..., "11" in Table 13 are information set as values for the item "PART1_P2" in the table T10. Values "0 B", "26 B", ..., "104 B" in the table T13 are the sizes of the parity P2 corresponding to the codes.

Thus, the parity size can be selected according to the intended use of each partition. For the intended use, for example, when an OS is stored, a storage area for programs and the OS may be set in Table 10 with the partition name "Partition 1", and the ECC1 scheme for 1 B per 8 B may be applied in order to deal with small accesses in units of 1 to 64 bytes. Furthermore, for example, when data is stored, a storage area for the data may be set in Table 20 with a partition name "Partition 2", and the ECC2 scheme for 52 B per 512 B may be applied in order to deal with large data of 512 B or 4 KB.

In addition, the latency CL can be set according to a processing time for each partition. Further, when an error is corrected in the memory device 200 as disclosed in the second embodiment, the processing time increases consistently with the number of error correction bits. In contrast, in the fifth modification, the latency CL can be set according to the increased processing time.

Second Embodiment

Now, a memory system according to a second embodiment will be described. The present embodiment is a modification of the first embodiment in which the memory controller 300 executes two types of ECC schemes. The memory device 200 executes the two types of ECC schemes. As the two types of ECC schemes, the ECC1 scheme and the ECC2 scheme, which have error correction capabilities of different levels, are used.

However, for the ECC2 scheme, the memory device 200 does not perform error correction but executes only error detection. Specifically, the second embodiment has a 1-bit error correction function and a 32-bit error correction function in the memory device 200. Only differences from the first embodiment will be described below.

[2-1] Configuration

[2-1-1] Configuration of the Memory Device

FIG. 15 is a schematic diagram depicting a configuration of the memory device according to the second embodiment. Compared to the configuration depicted in FIG. 2, the memory device 200 does not have the scrub flag SFLAG in the memory cell array 207 but further comprises an ECC1 control circuit 210 and a scrub address control circuit 211. The memory cell array 207 includes a data storage area that stores data and a parity area that stores the parities P1, P2. The first parity P1 and the second parity P2 may be used to execute error correction in different ranges in the memory cell array 207. The data and the first parity P1 may be stored in the same bank in the memory cell array 207 and in a page with the same row address. The second parity P2 may be distributively stored in a plurality of banks in the memory cell array 207.

Here, the ECC1 control circuit 210 comprises a single error correction double error detection (SECDED) circuit 210A and a 32-bit error detection (32ED) circuit 210B.

The SECDED circuit (first ECC1 control circuit) 210A performs error correction using the ECC1 scheme and the first parity P1 when the read operation is performed on the memory cell array. For example, the SECDED circuit 210A executes 1-bit error correction and 2-bit error correction per 8 B.

When an error that is uncorrectable by the SECDED circuit 210A occurs, the 32ED circuit (error detection circuit) 210B executes error detection using the ECC2 scheme. For example, the 32ED circuit 210B executes error detection for 32 bits per 512 B.

On the other hand, the scrub address control circuit 211 manages addresses in a scrub target area used for the scrub operation. Specifically, for example, the scrub address control circuit 211 has an address counter that indicates the addresses in the scrub target area, and reads data and the parity from the memory cell array 207 according to the value in the address counter for output each time the scrub command or the refresh command is received. Furthermore, when the scrub target area indicated by the value in the address counter is updated, the value in the address counter is cyclically updated. For example, the scrub address control circuit 211 manages the address counter such that the value in the address counter is incremented in order starting with the least significant address and returns to the least significant address upon reaching the most significant address. Here, the addresses in the scrub target area may be the addresses in the entire data storage area or addresses at which errors were previously detected (error addresses).

Alternatively, the scrub address control circuit 211 may preferentially perform the scrub operation on the area indicated by error addresses and then on the areas not indicated by the error addresses. In this case, the scrub address control circuit 211 further comprises a register that is used for the scrub operation on the memory cell array 207 and in which a range of addresses (error addresses) is registered within which an error that is uncorrectable by the SECDED circuit 210A has occurred. During the scrub operation, the scrub address control circuit 211 preferentially reads the range indicated by the addresses and outputs the result of the read to the memory controller 300.

The scrub address control circuit 211 may, for example, save the error addresses to the memory cell array 207 and read the error addresses from the memory cell array 207 into the register or the address counter.

[2-1-2] Configuration of the Memory Controller

FIG. 16 is a schematic diagram depicting the configuration of the memory controller in the memory system. Compared to the configuration depicted in FIG. 4, the memory controller 300 comprises an ECC control circuit 308 that uses one type of ECC scheme instead of the ECC control circuit 307 that uses the two types of ECC schemes.

Here, the ECC control circuit 308 comprises a 32 b error correction circuit 308A that uses the ECC2 scheme. The 32 b error correction circuit 308A executes error correction for 32 bits per 512 B during the read operation and the write operation. During the scrub operation, the 32 b error correction circuit 308A may execute error correction so as to give priority to the range indicated by the addresses registered in the register in the scrub address control circuit 211. In this case, upon receiving the read result for the range indicated by the addresses, from the memory device 200 during the scrub operation, the 32 b error correction circuit 308A executes error correction on the data and parity P1 in the read result based on the parity P2 in the read result.

[2-2] Operations

Now, operations of the memory system configured as described above will be described using FIGS. 17 to 20. The description below will be given in an order of the read operation, the write operation, and the scrub operation.

[2-2-1] Read Operation

FIG. 17 is a flowchart illustrating the read operation of the memory device 200. In brief, in the read operation, a 1-bit error is corrected based on the parity P1 (ST53 to ST54), and an alarm is output form an error for 2 to 32 bits (ST57, ST59, ST60). A dashed line enclosing steps ST57, ST59 to ST60 is drawn to facilitate comparison with the comparative example described below. The read operation of the memory device 200 will be described below in detail.

First, in the memory device 200, the first ECC control circuit 210 reads the parity P1 (RPin) from the memory cell array 207 along with the read data RDin (ST51). For example, 8 B of data and 1 B of the parity P1 are read.

The SECDED circuit 210A executes error correction using the parity P1 (ST52 to ST54). First, the SECDED circuit 210A determines whether or not an error is present in the read data RDin (ST52). When no error is found, the SECDED circuit 210A shifts to step ST56. In step ST56, the ECC control circuit 210 outputs the read data RDout to the memory controller 300 via the I/O controller 205 and the I/O buffer 204. Thus, the read operation on the memory device 200 side ends.

On the other hand, when the result of the determination in step ST52 indicates the presence of an error, the SECDED circuit 210A corrects the error if the error correction can be achieved using the ECC1 scheme (ST53 to ST54). Specifically, the SECDED circuit 210A determines whether or not the error is 1 bit (ST53). When the error is 1 bit, the SECDED circuit 210A corrects the error (ST54). Subsequently, the SECDED circuit 210A writes the corrected data and parity P1 back to the memory cell array 207 (ST55). The write-back of the corrected data may be performed later. After step ST55, the SECDED circuit 210A shifts to step ST56 to output the corrected data to the memory controller 300 to end the read operation.

In contrast, when the result of the determination in step ST53 is negative, the 32ED circuit 210B determines whether or not the error is 32 bits (ST57). When the result of the determination in step ST57 is negative, the 32ED circuit 210B executes the error process (ST58). After the error process, the read operation ends.

On the other hand, when the result of the determination in step ST57 indicates that the error is 32 bits or less, the 32ED circuit 210B registers the address of data determined to be erroneous (error address) in the scrub address control circuit 211 (ST59). Subsequently, the 32ED circuit 210B outputs an alert to the memory controller 300 via the I/O controller 205 and the I/O buffer 204 (ST60). The alert contains, for example, the error address. After step ST60, the 32ED circuit 210B shifts to step ST6. Then, the read operation on the memory device 200 side ends.

Figure 18:
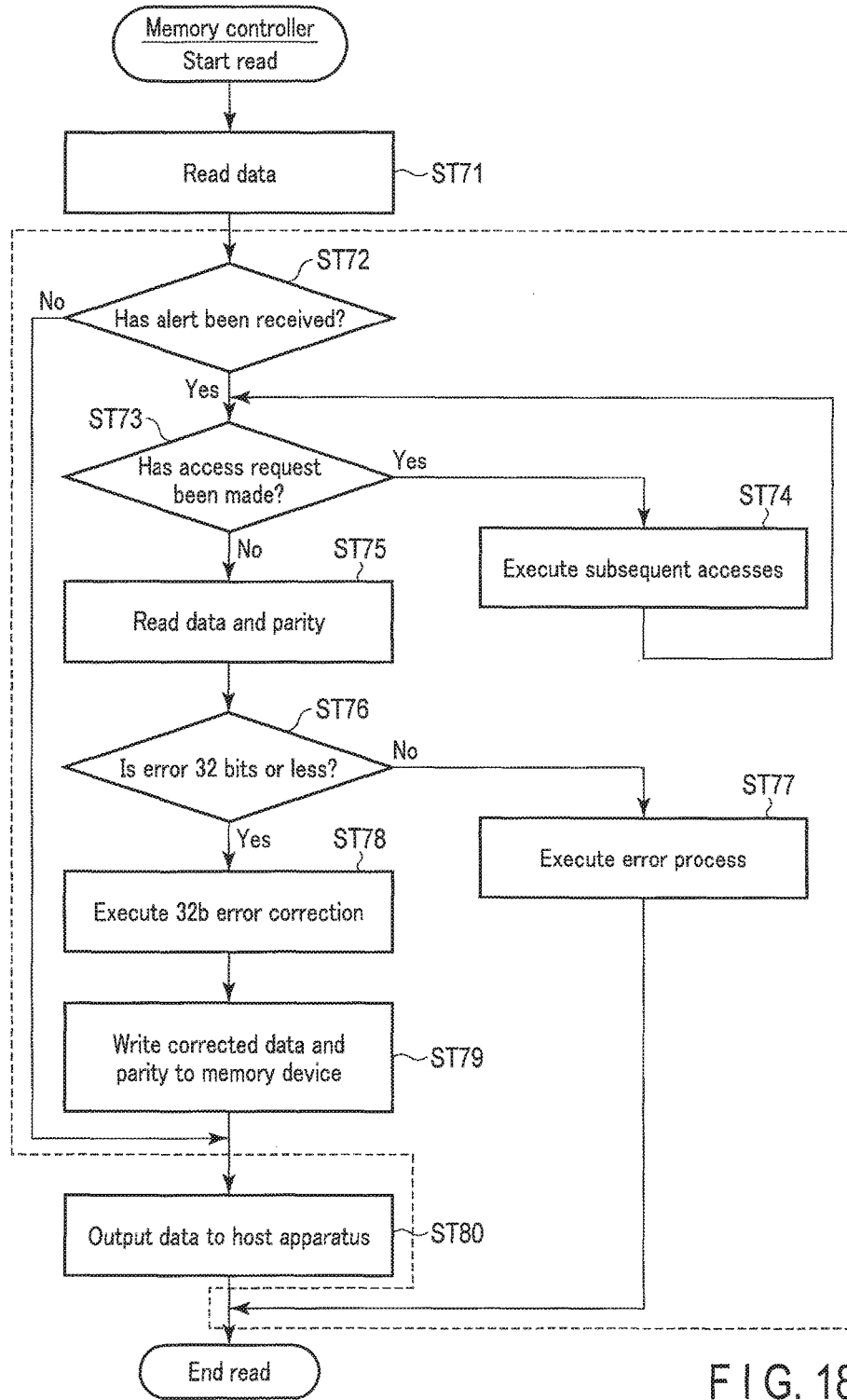
FIG. 18 is a flowchart illustrating a read operation in the memory controller according to the second embodiment.

FIG. 18 is a flowchart illustrating the read operation of the memory controller 300. In brief, in the read operation, if the alarm is received when data is read from the memory device 200 (ST71 to ST72), an attempt is made to make correction using the powerful parity P2 (ST75, ST76, ST78). A dashed line enclosing steps ST72 to ST79 is drawn to facilitate comparison with the comparative example described below. Steps ST73 to ST74 may be executed after step ST80. That is, in the example illustrated in FIG. 18, the error correction is executed when no access request follows the reception of the alert. However, the error correction may be executed immediately after the reception of the alert. The read operation of the memory controller 300 will be described below in detail.

First, in the memory controller 300, the ECC control circuit 308 reads the read data RDin from the memory device 200 (ST71) and then determines whether or not the alert has been received from the memory device 200 within a predetermined period following the read (ST72). When the result of the determination is negative, the ECC control circuit 308 shifts to step ST80 to output the read data RDout to the host device 400 via the read data FIFO 305. Thus, the read operation ends.

When the result of the determination in step ST72 indicates that the alert has been received, the ECC control circuit 308 holds the error address contained in the alert, in a buffer (not depicted in the drawings). Subsequently, the ECC control circuit 308 determines whether or not a subsequent access request has been made (ST73). When the subsequent access request has been made, the ECC control circuit 308 executes the subsequent access (ST74).

When the result of the determination in step ST73 indicates that no subsequent access request has been made, the ECC control circuit 308 reads data and the parity P2 from the memory device 200 (ST75). For example, 512 B of data and 52 B of the parity P2 are read.

The ECC control circuit 308 corrects the error when the error correction can be achieved using the ECC2 scheme (ST76, ST78). Specifically, the ECC control circuit 308 determines whether or not the error is 32 bits or less (ST76). When the result of the determination is negative, the ECC control circuit 308 shifts to the error process in step ST77.

When the result of the determination in step ST76 indicates that the error is 32 bits or less, the 32 b error correction circuit 308A corrects the error (ST78). Subsequently, the ECC control circuit 308 writes the corrected data and parity P2 back to the memory device 200 (ST79). The write-back of the corrected data may be performed later. After step ST79, the ECC control circuit 308 shifts to step ST80 to output the corrected data to be host device 400. Thus, the read operation ends.

[2-2-2] Write Operation

Figure 19:
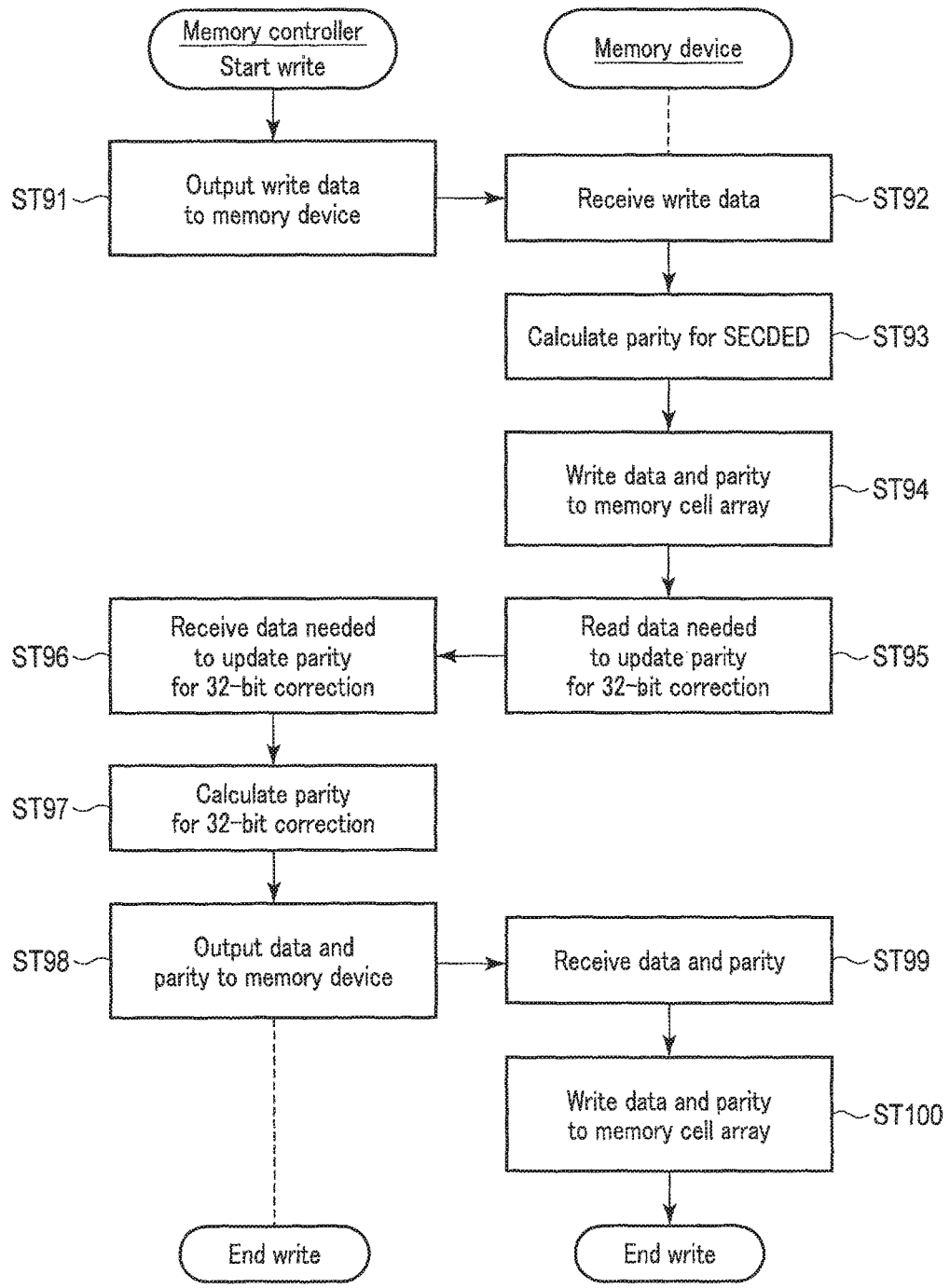
FIG. 19 is a flowchart illustrating a write operation in the second embodiment.

FIG. 19 is a flowchart illustrating the read operation in the memory controller and the memory device.

First, the memory controller 300 outputs the write data to the memory device 200 (ST91).

The memory device 200 receives the write data (ST92). The ECC control circuit 210 allows the SECDED circuit 210A to calculate the parity P1 for SECDED from the received data (ST93). The ECC control circuit 210 writes the data and the first parity P1 to the memory cell array 207 (ST94), and reads, from the memory cell array 207, data needed to update the parity P2 for 32-bit correction (ST95). The needed data includes, for example, the data written in step 94 and the address of the data. The ECC control circuit 210 outputs the data read in step ST95 to the memory controller 300.

The memory controller 300 receives data needed to update the parity P2 for 32-bit correction (ST96). The ECC control circuit 308 allows the 32 b error correction circuit 308A to calculate the parity P2 for 32-bit correction from the received data (ST97). The ECC control circuit 308 outputs the data and the parity P2 to the memory device 200 (ST98). Thus, the write operation on the memory controller 300 ends.

The memory device 200 receives the data and the parity P2 (ST99), and writes the data and the parity P2 to the memory cell array 207 (ST100). Thus, the write operation on the memory device 200 ends.

[2-2-3] Scrub Operation

FIG. 20 is a flowchart illustrating the scrub operation. A dashed line enclosing step ST112 is drawn to indicate a portion significantly different from a corresponding portion in the comparative example described below. A trigger to start the scrub operation may be a signal received from the timer 306 by the ECC control circuit 308 or the refresh command received from the host device 400 by the ECC control circuit 308 and the memory access controller 303. The scrub operation of the memory controller 300 will be described.

First, using the signal output by the timer 306 or the refresh command received from the host device 400, the memory controller 300 outputs a scrub command to the memory device 200.

In the memory device 200, during the scrub operation based on the scrub command, the scrub address control circuit 211 preferentially reads the range indicated by the corresponding addresses, and outputs the result of the read to the memory controller 300.

Thus, the memory controller 300 reads, from the memory device 200, the data and parity corresponding to the addresses in the scrub target area managed by the scrub address control circuit 211 (ST111).

Upon receiving the result of read of the range indicated by the addresses, from the memory device 200 during the scrub operation, the 32 b error correction circuit 308A determines whether or not the error in the read data is 32 bits or less (ST112). When the result of the determination is negative, the 32 b error correction circuit 308A shifts to an error process in step ST113.

When the result of the determination in step ST112 indicates that the error is 32 bits or less, the 32 b error correction circuit 308A executes error correction on the data and parity P1 in the read result (ST114). Thus, subsequently, the ECC control circuit 308 writes the corrected data and parity P2 back to the memory device 200 (ST115).

When the data and the parity P2 are written to the scrub target area, the scrub address control circuit 211 increments the value in the address counter, which is indicative of an address in the scrub target area (ST116). Thus, the scrub operation ends.

[2-3] Effects of the Second Embodiment

The present embodiment can produce effects similar to the effects of the first embodiment even when configured such that the memory device 200 has the 1-bit error correction function and the 32-bit error detection function and such that the memory controller 300 has the 32-bit error correction function.

Now, the effects of the present embodiment will be described taking the memory system disclosed below as an example. Unlike in the memory device 200 depicted in FIG. 15, the parity P2 for the ECC2 scheme, the 32ED circuit 210B, and the scrub address control circuit 211 are omitted from the memory device in the memory system in the comparative example. In the memory device in the comparative example, the ECC control circuit has only the SECDED circuit 210A. The memory controller in the comparative example does not have the 32 b error correction circuit 308A and executes the ECC1 scheme. That is, the memory system in the comparative example does not have a configuration for the ECC2 scheme or effects based on the ECC2 scheme.

Now, the read operation, the write operation, and the scrub operation of the memory system in the comparative example will be described.

The memory device in the comparative example executes only steps ST51 to ST56, ST58 that are included in the read operation illustrated in FIG. 17 and that are related to the ECC1 scheme. In other words, the memory device in the comparative example omits execution of steps ST51 to ST56, ST58 that are included in the read operation illustrated in FIG. 17 and that are related to the ECC2 scheme.

The memory controller in the comparative example executes only steps ST71, ST80 that are included in the read operation illustrated in FIG. 18 and that are related to the ECC1 scheme. In other words, the memory controller 300c in the comparative example omits execution of steps ST72 to ST79 that are included in the read operation illustrated in FIG. 18 and that are related to the ECC2 scheme.

The memory system in the comparative example executes only steps ST91 to ST94 that are included in the write operation illustrated in FIG. 19 and that are related to the ECC1 scheme. In other words, the memory device in the comparative example omits execution of steps ST95 to ST100 that are included in the write operation illustrated in FIG. 19 and that are related to the ECC2 scheme.

The memory controller in the comparative example executes only steps ST38 to ST43 that are included in the scrub operation illustrated in FIG. 7 and that are related to the ECC1 scheme. In other words, the memory controller in the comparative example omits execution of steps ST31 to ST37, ST44 that are included in the scrub operation illustrated in FIG. 7 and that are related to the ECC2 scheme.

As described above, the memory system in the comparative example is configured not to execute the steps related to the ECC2 scheme and does not produce the effects based on the ECC2 scheme.

On the other hand, in the present embodiment, the memory device 200 executes the ECC1 scheme, and the memory device 200 and the memory controller 300 perform the error detection and error correction based on the ECC2 scheme, respectively. The present embodiment can thus produce effects similar to the effects of the first embodiment.

[2-4] Modifications of the Second Embodiment

By utilizing the modifications of the first embodiment, the memory system according to the first embodiment can produce effects similar to the effects of medications of the first embodiment.

In addition, the first and second embodiments and the modifications thereof are not limited to those described above but may be subjected to many variations. For example, in the above-described embodiments, the case has been described where the memory device 200 and the memory controller 300 are separate semiconductor chips. However, the memory device 200 and the memory controller 300 may be formed on one chip.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory system comprising:
a memory cell array configured to store data, a first parity generated in association with the data based on a first error correction code (ECC) scheme, and a second parity generated in association with the data and the first parity based on a second error correction code (ECC) scheme;
a first ECC control circuit configured to execute a first error correction using the first ECC scheme and the first parity during a read operation on the memory cell array;
a second ECC control circuit configured to execute a second error correction using the second ECC scheme and the second parity during a scrub operation on the memory cell array; and
a register in which a range of addresses is registered within which an error uncorrectable by the first error correction with the first ECC control circuit has occurred,
wherein the first ECC scheme and the second ECC scheme have error correction capabilities of different levels, and
wherein the second ECC control circuit executes the second error correction so as to give priority to the range indicated by the registered addresses.

2. The memory system according to claim 1, wherein the first ECC control circuit and the second ECC control circuit execute error correction in different ranges in the memory cell array.

3. The memory system according to claim 1, wherein the data and the first parity are stored in an identical bank in the memory cell array and in a page with an identical row address, and
wherein the second parity is distributively stored in a plurality of banks in the memory cell array or in a plurality of chips.

4. The memory system according to claim 1, wherein the memory cell array further stores a scrub flag that indicates invalidity of the second parity in response to rewrite of at least one of the data and the first parity.

5. The memory system according to claim 1, wherein, upon externally receiving a refresh command, the second ECC control circuit performs the scrub operation.

6. The memory system according to claim 1, wherein the memory cell array is mounted on a first semiconductor chip, and
wherein the first ECC control circuit and the second ECC control circuit are mounted on a second semiconductor chip different from the first semiconductor chip.

7. A memory device comprising:
a memory cell array configured to store data, a first parity generated in association with the data based on a first error correction code (ECC) scheme, and a second parity generated in association with the data and the first parity based on a second error correction code (ECC) scheme;
a first ECC control circuit configured to execute a first error correction using the first ECC scheme and the first parity during a read operation on the memory cell array;
an error detection circuit configured to execute error detection using the second ECC scheme when an error occurs which is uncorrectable by the first error correction with the first ECC control circuit; and
a register in which a range of addresses indicating the error detected by the error detection circuit is registered, the registered addresses being used in executing a second error correction during a scrub operation on the memory cell array,
wherein the first ECC scheme and the second ECC scheme have error correction capabilities of different levels.

8. The memory device according to claim 7, wherein the first parity and the second parity are used to execute error correction in different ranges in the memory cell array.

9. The memory device according to claim 7, wherein the data and the first parity are stored in an identical bank in the memory cell array and in a page with an identical row address, and
wherein the second parity is distributively stored in a plurality of banks in the memory cell array.

10. The memory device according to claim 7, further comprising a scrub control circuit configured to preferentially read the range indicated by the addresses from the memory cell array and to output a result of the read, during the scrub operation.

* * * * *